(12) United States Patent
Sim et al.

(10) Patent No.: US 11,404,434 B2
(45) Date of Patent: Aug. 2, 2022

(54) THREE-DIMENSIONAL SEMICONDUCTOR MEMORY DEVICE

(71) Applicant: SAMSUNG ELECTRONICS CO., LTD., Suwon-si (KR)

(72) Inventors: Jaeryong Sim, Hwaseong-si (KR); Jongseon Ahn, Seongnam-si (KR); Jeehoon Han, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 190 days.

(21) Appl. No.: 16/842,252

(22) Filed: Apr. 7, 2020

(65) Prior Publication Data

US 2021/0036010 A1  Feb. 4, 2021

(30) Foreign Application Priority Data

Aug. 2, 2019 (KR) .......... 10-2019-0094346

(51) Int. Cl.
| | |
|---|---|
| H01L 27/11582 | (2017.01) |
| H01L 27/11519 | (2017.01) |
| H01L 27/11524 | (2017.01) |
| H01L 27/11529 | (2017.01) |
| H01L 23/522 | (2006.01) |
| H01L 27/11565 | (2017.01) |
| H01L 27/1157 | (2017.01) |
| H01L 27/11573 | (2017.01) |
| H01L 27/11556 | (2017.01) |

(52) U.S. Cl.
CPC .... *H01L 27/11582* (2013.01); *H01L 23/5226* (2013.01); *H01L 27/1157* (2013.01); *H01L 27/11519* (2013.01); *H01L 27/11524* (2013.01); *H01L 27/11529* (2013.01); *H01L 27/11556* (2013.01); *H01L 27/11565* (2013.01); *H01L 27/11573* (2013.01)

(58) Field of Classification Search
CPC ................................. H01L 27/11582
See application file for complete search history.

(56) References Cited

U.S. PATENT DOCUMENTS

| | | | |
|---|---|---|---|
| 8,395,206 | B2 | 3/2013 | Lee et al. |
| 9,076,502 | B2 | 7/2015 | Nakajima |
| 9,716,099 | B2 | 7/2017 | Choi |
| 9,978,771 | B2 | 5/2018 | Hwang |
| 10,115,667 | B2 | 10/2018 | Yun et al. |
| 10,217,757 | B2 | 2/2019 | Shimojo |
| 2017/0092733 | A1 | 3/2017 | Makala et al. |
| 2018/0247951 | A1 | 8/2018 | Fujii et al. |

(Continued)

*Primary Examiner* — Christopher A Johnson
(74) *Attorney, Agent, or Firm* — F. Chau & Associates, LLC

(57) ABSTRACT

A semiconductor memory device includes horizontal patterns disposed on a peripheral circuit structure and spaced apart from each other in a first direction. Memory structures are disposed on the horizontal patterns. The memory structures include source structures and electrode structures. A division structure is disposed between adjacent horizontal patterns in the first direction and is configured to separate the source structures of adjacent memory structures from each other. An etch stop pattern is disposed between the horizontal patterns at a level lower than a level of the source structures. The etch stop pattern is connected to a lower portion of the division structure.

19 Claims, 29 Drawing Sheets

(56) References Cited

U.S. PATENT DOCUMENTS

| | | |
|---|---|---|
| 2018/0277499 A1 | 9/2018 | Oshiki |
| 2018/0366486 A1 | 12/2018 | Hada et al. |
| 2019/0035725 A1 | 1/2019 | Yun et al. |
| 2019/0057898 A1 | 2/2019 | Shim et al. |
| 2019/0088586 A1* | 3/2019 | Ichinose ............. H01L 27/0629 |

* cited by examiner

THREE-DIMENSIONAL SEMICONDUCTOR MEMORY DEVICE

CROSS-REFERENCE TO RELATED APPLICATION

This application claims priority under 35 U.S.C. § 119 to Korean Patent Application No. 10-2019-0094346, filed on Aug. 2, 2019 in the Korean Intellectual Property Office, the disclosure of which is incorporated by reference in its entirety herein.

TECHNICAL FIELD

The present inventive concepts relate to a three-dimensional semiconductor memory device and a method of fabricating the same, and in particular, to a highly-integrated three-dimensional semiconductor memory device and a method of fabricating the same.

DISCUSSION OF RELATED ART

Consumer demand for electronic devices that provide a superior performance and are relatively inexpensive has resulted in the need for higher integration of semiconductor devices. In the case of two-dimensional or planar semiconductor devices, since their integration is mainly determined by the area occupied by a unit memory cell, integration is greatly influenced by the level of a fine pattern forming technology. However, an increase in the pattern fineness requires very expensive equipment and there is a practical limitation on the pattern fineness. Therefore, three-dimensional semiconductor memory devices including three-dimensionally arranged memory cells have recently been proposed.

SUMMARY

An exemplary embodiment of the present inventive concepts provides a three-dimensional semiconductor memory device with an increased integration density.

An exemplary embodiment of the present inventive concepts provides a method of reducing a process failure in a process of fabricating a three-dimensional semiconductor memory device.

According to an exemplary embodiment of the present inventive concepts, a semiconductor memory device includes horizontal patterns disposed on a peripheral circuit structure and spaced apart from each other in a first direction. Memory structures are disposed on the horizontal patterns. The memory structures include source structures and electrode structures. A division structure is disposed between adjacent horizontal patterns in the first direction and is configured to separate the source structures of adjacent memory structures from each other. An etch stop pattern is disposed between the horizontal patterns at a level lower than a level of the source structures. The etch stop pattern is connected to a lower portion of the division structure.

According to an exemplary embodiment of the present inventive concepts, a semiconductor memory device includes horizontal patterns disposed on a peripheral circuit structure and spaced apart from each other with a division region interposed therebetween in a first direction. The division region includes a first insulating penetration layer. Memory structures are disposed on the horizontal patterns. The memory structures include source structures and electrode structures on the source structures. Vertical structures penetrate the electrode structures and are connected to the source structures. A division structure is disposed in the division region and is configured to separate the source structures of adjacent memory structures from each other. An etch stop pattern is disposed between the horizontal patterns and is disposed at a level lower than a level of the horizontal patterns. The etch stop pattern is connected to a lower portion of the division structure. Penetration plugs are configured to connect the memory structures to the peripheral circuit structure. The source structures comprise first conductive source patterns disposed on the horizontal patterns and second conductive source patterns disposed between the first conductive source patterns and the horizontal patterns. The first conductive source patterns extend to the division region and are connected to sidewalls of the division structure.

According to an exemplary embodiment of the present inventive concepts, a semiconductor memory device may include horizontal patterns disposed on a peripheral circuit structure and spaced apart from each other in a first direction. Memory structures are disposed on the horizontal patterns. The memory structures include source structures and electrode structures on the source structures. A division structure is disposed between adjacent horizontal patterns in the first direction. The division structure is configured to separate the source structures of adjacent memory structures from each other. An etch stop pattern is disposed between the horizontal patterns and is connected to a lower portion of the division structure. Penetration plugs connect the memory structures to the peripheral circuit structure. The etch stop pattern is disposed at a same level as a level of the horizontal patterns.

According to an exemplary embodiment of the present inventive concepts, a method for manufacturing a semiconductor memory device includes forming a peripheral circuit structure on a substrate. Horizontal patterns are formed on the peripheral circuit structure and spaced apart from each other in a first direction. A portion of the horizontal patterns contact an edge of the substrate. Memory structures are formed on the horizontal patterns. The memory structures include source structures and electrode structures on the source structures. Vertical structures are formed that penetrate the electrode structures and are connected to the source structures. A division structure is formed between adjacent horizontal patterns in the first direction. The division structure is configured to separate the source structures of adjacent memory structures from each other. An etch stop pattern is formed between the horizontal patterns and is disposed at a level lower than a level of the source structures. The etch stop pattern is connected to a lower portion of the division structure. The horizontal patterns are configured to discharge electrical charges on surfaces of the horizontal patterns to the semiconductor substrate.

BRIEF DESCRIPTION OF THE DRAWINGS

Exemplary embodiments will be more clearly understood from the following brief description taken in conjunction with the accompanying drawings. The accompanying drawings represent non-limiting, exemplary embodiments as described herein.

It should be noted that these figures are intended to illustrate the general characteristics of methods, structure and/or materials utilized in certain exemplary embodiments and to supplement the written description provided below. However, these drawings may not be to scale and may not precisely reflect the precise structural or performance characteristics of any given embodiment, and should not be interpreted as defining or limiting the range of values or properties encompassed by exemplary embodiments of the present inventive concepts. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXEMPLARY EMBODIMENTS

Figure 1:
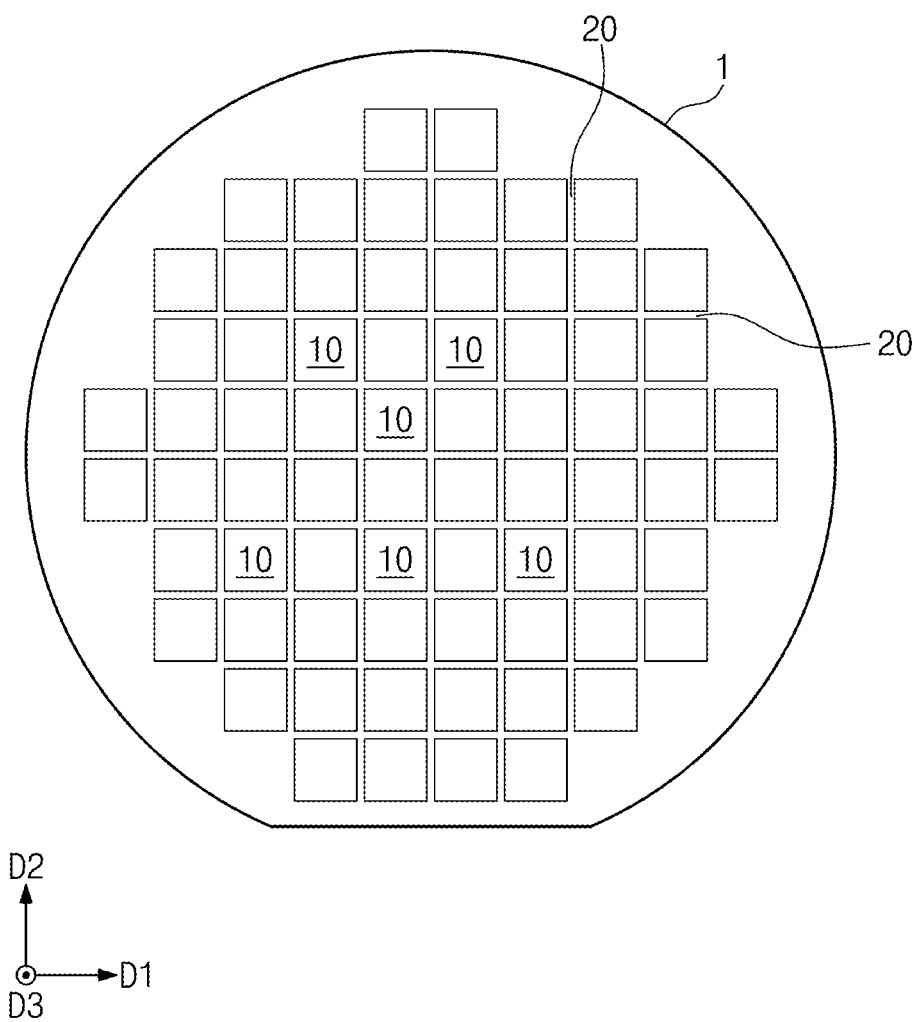
FIG. 1 is a top plan view illustrating a substrate that includes three-dimensional semiconductor memory devices integrated thereon according to an exemplary embodiment of the present inventive concepts.

FIG. 1 is a top plan view illustrating a substrate, on which three-dimensional semiconductor memory devices according to an exemplary embodiment of the present inventive concepts are integrated.

Referring to FIG. 1, a semiconductor substrate 1 (e.g., a wafer, etc.) may include chip regions 10 which include semiconductor chips formed thereon, and a scribe line region 20, located between the chip regions 10. In an exemplary embodiment, the semiconductor substrate 1 may include a plurality of discrete chip regions that are two-dimensionally arranged in two different directions (e.g., a first direction D1 and a second direction D2). Each of the chip regions 10 may be surrounded by the scribe line region 20. In other words, the scribe line region 20 may be disposed between each adjacent pair of the chip regions 10, which are adjacent to each other in the first and/or second directions D1 and D2. While the chip regions 10 are shown in the exemplary embodiment of FIG. 1 as comprising a plurality of square-shaped chip regions arranged in rows and columns, exemplary embodiments of the present inventive concepts are not limited thereto. For example, the chip regions 10 may have different shapes in a plan view (e.g., when viewed from the third direction D3) and the plurality of chip regions may have various different arrangements.

In an exemplary embodiment, the semiconductor substrate 1 may be a bulk silicon wafer, a silicon-on-insulator (SOI) wafer, a germanium wafer, a germanium-on-insulator (GOI) wafer, a silicon-germanium wafer, a thin wafer including an epitaxial layer formed by a selective epitaxial growth (SEG) process, etc. In the three-dimensional semiconductor memory device according to an exemplary embodiment of the present inventive concepts, memory cells may be three-dimensionally arranged on each of the chip regions 10 of the semiconductor substrate 1.

Figure 2:
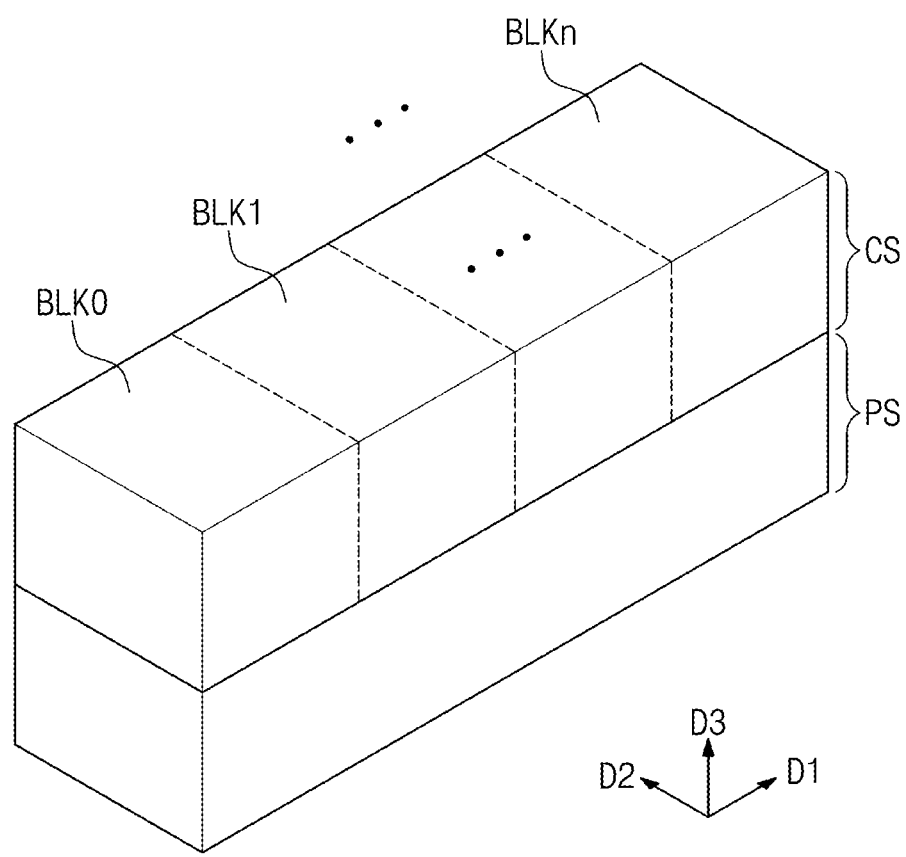
FIG. 2 is a perspective view illustrating a three-dimensional semiconductor device according to an exemplary embodiment of the present inventive concepts.

FIG. 2 is a perspective view schematically illustrating a three-dimensional semiconductor device according to an embodiment of the inventive concept.

Referring to FIG. 2, a three-dimensional semiconductor memory device according to an exemplary embodiment of the present inventive concept may include a peripheral circuit structure PS and a cell array structure CS on the peripheral circuit structure PS. The cell array structure CS may be overlapped with the peripheral circuit structure PS, when viewed in a plan view. For example, as shown in the exemplary embodiment of FIG. 2, the cell array structure CS may be disposed directly on the peripheral circuit structure (e.g., in the third direction D3).

In an exemplary embodiment, the peripheral circuit structure PS may include row and column decoders, a page buffer, control circuits, and peripheral logic circuits. However, exemplary embodiments of the present inventive concepts are not limited thereto and the peripheral circuit structure PS may not include one or more of these components or may include additional components. The peripheral logic circuits of the peripheral circuit structure PS may be integrated on the semiconductor substrate.

The cell array structure CS may include a plurality of memory cells, which are three-dimensionally arranged. The cell array structure CS may include one or more mats, each of which includes a plurality of memory blocks BLK0-BLKn. Each of the memory blocks BLK0-BLKn may include a plurality of memory cells, which are three-dimensionally arranged.

For example, in an exemplary embodiment, each of the memory blocks BLK0-BLKn may include a plurality of electrode structures, vertical patterns that vertically cross the electrode structures, and memory elements, which are interposed between sidewalls of the electrode structures and the vertical patterns. Each of the electrode structures may be formed of or include at least one conductive material, such as doped silicon or metallic materials, and may be provided in the form of a line or plate. However, exemplary embodiments of the present inventive concepts are not limited thereto.

The peripheral circuit structure PS and the cell array structure CS may be sequentially formed on the same wafer. However, in other exemplary embodiments, a first wafer with the peripheral circuit structure PS and a second wafer with the cell array structure CS may be separately prepared, and then, the first wafer may be bonded to the second wafer to form the semiconductor device.

Figure 3:
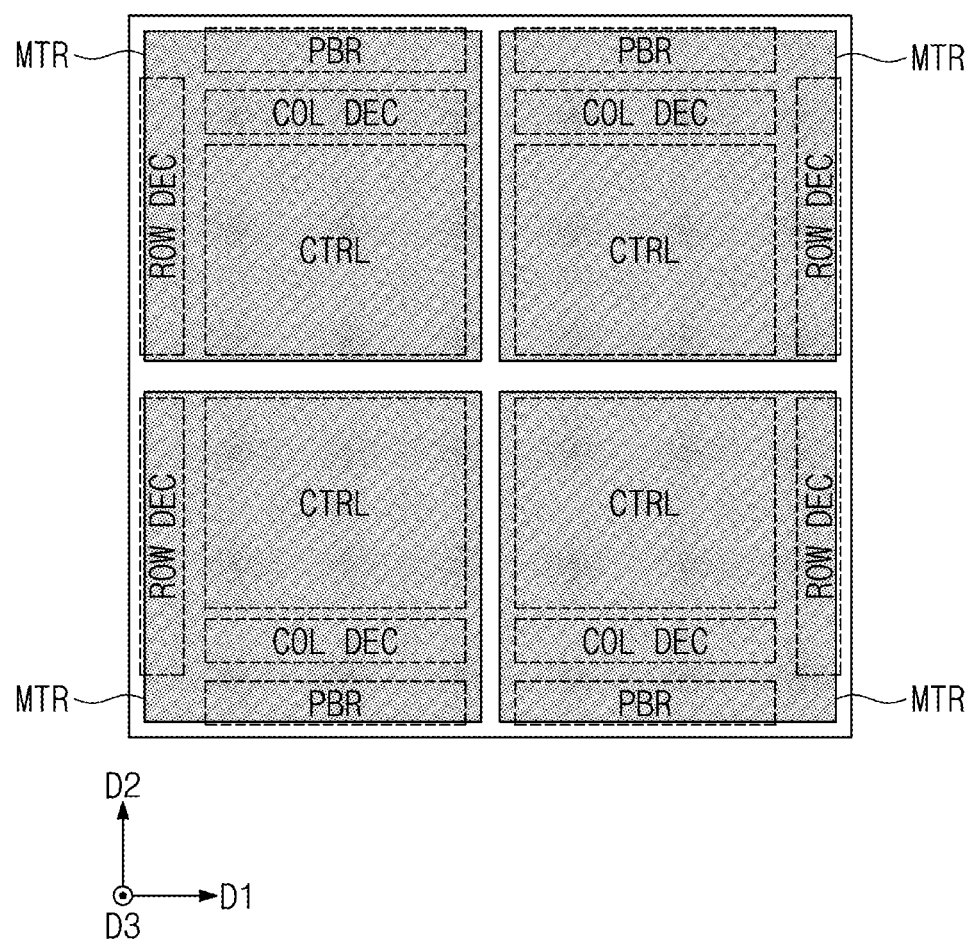
FIG. 3 is a top plan view illustrating a three-dimensional semiconductor memory device according to an exemplary embodiment of the present inventive concepts.

FIG. 3 is a top plan view schematically illustrating a three-dimensional semiconductor memory device according to an exemplary embodiment of the present inventive concepts.

Referring to FIGS. 1 and 3, the peripheral circuit structure PS and the cell array structure CS described with reference to FIG. 2 may be disposed on each of the chip regions 10 of the semiconductor substrate 1.

In each of the chip regions 10, the peripheral circuit structure PS (e.g., see FIG. 2), may be disposed on the semiconductor substrate 1. As shown in the exemplary embodiment of FIG. 3, the peripheral circuit structure PS may include row and column decoders ROW DEC and COL DEC, a page buffer PBR, and control circuits CTRL. However, exemplary embodiments of the present inventive concepts are not limited thereto.

A plurality of mats MTR constituting the cell array structure CS (e.g., see FIG. 2) may be disposed in each chip region 10. The plurality of mat regions MTR may be arranged in the first direction D1 and the second direction D2. The plurality of mats MTR may be disposed to be overlapped with the peripheral circuit structure PS (e.g., see FIG. 2). For example, the plurality of mats MTR may be disposed on the peripheral circuit structure PS in the third direction D3. The components of the peripheral circuit structure PS, such as the row and column decoders ROW DEC and COL DEC, the page buffer PBR, and the control circuits CTRL may be disposed below each of the mat regions MTR, as shown in the exemplary embodiment of FIG. 3. However, in other exemplary embodiments, a plurality of mat regions MTR may share a single peripheral circuit structure. According to an exemplary embodiment of the present inventive concepts, the peripheral logic circuits constituting the peripheral circuit structure PS may be freely disposed below the mat regions MTR (e.g., in the third direction D3).

Figure 4A:
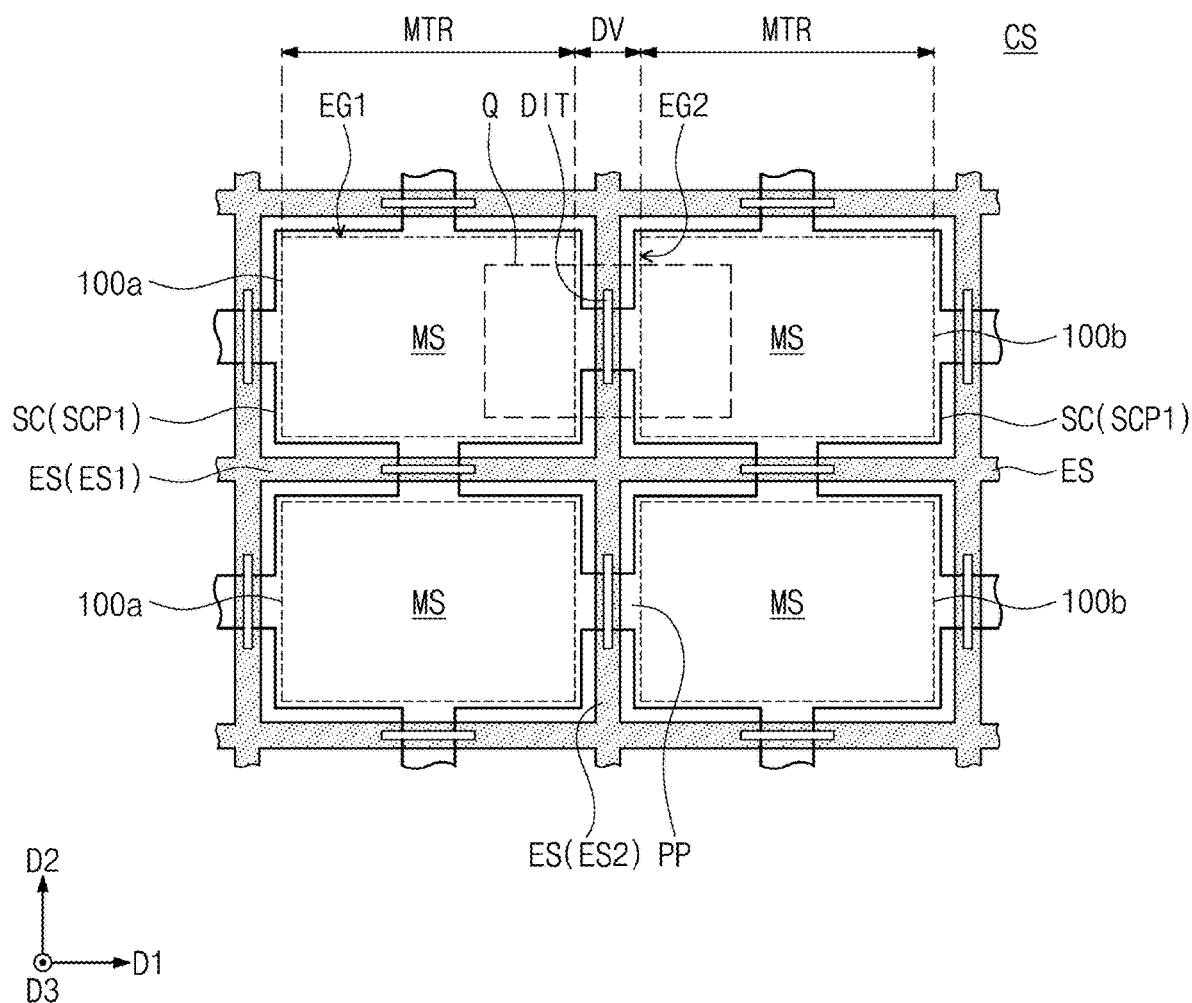
FIGS. 4A and 4B are top plan views illustrating a cell array structure of a three-dimensional semiconductor memory device according to exemplary embodiments of the present inventive concepts.
Figure 4B:
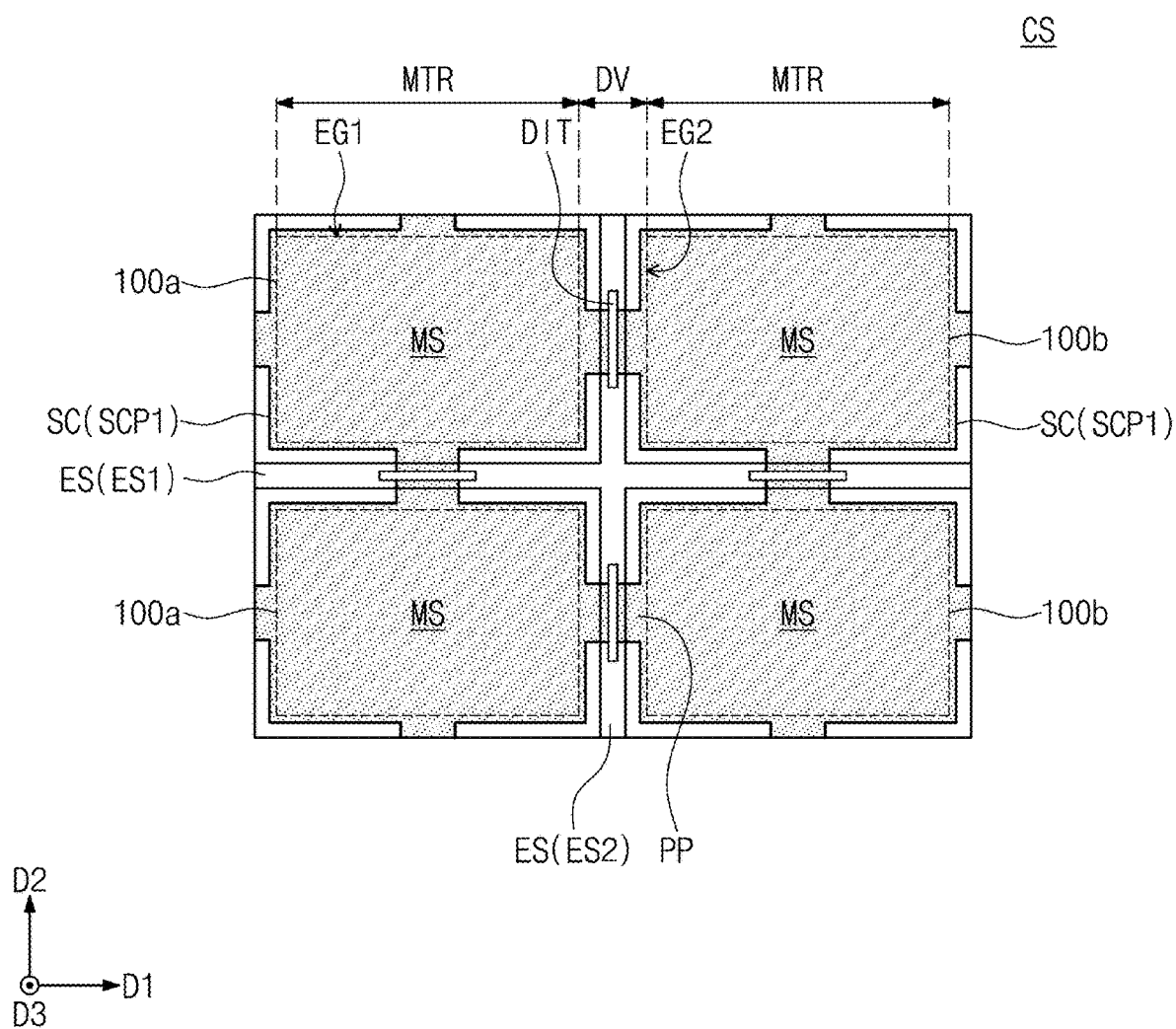
Figure 5:
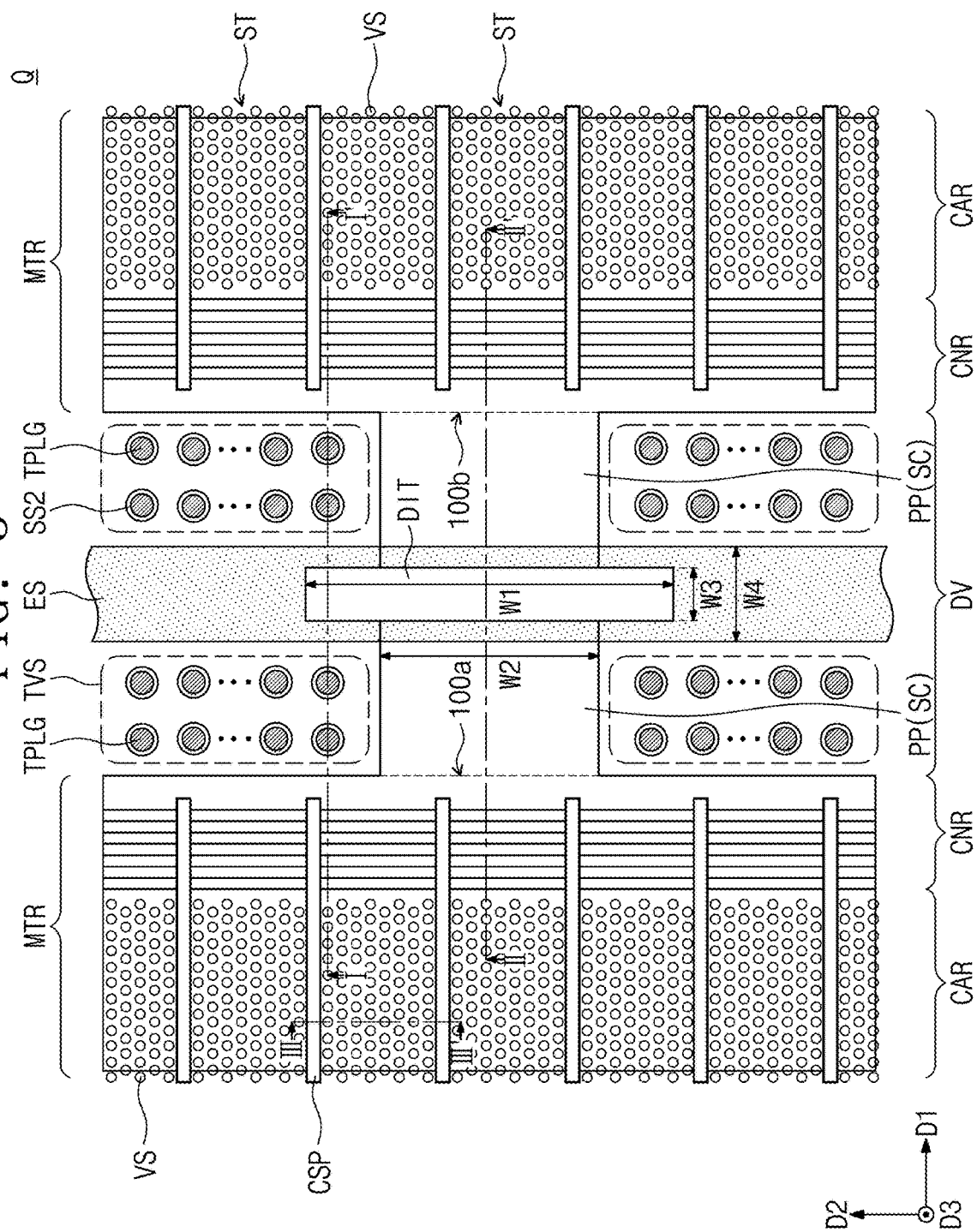
FIG. 5 is an enlarged top plan view of a region 'Q' of FIG. 4A according to an exemplary embodiment of the present inventive concepts.

FIGS. 4A and 4B are top plan views, each of which schematically illustrates a cell array structure of a three-dimensional semiconductor memory device according to exemplary embodiments of the present inventive concepts. FIG. 5 is an enlarged view of a region 'Q' of FIG. 4A.

Referring to FIGS. 4A and 5, the cell array structure CS may include a plurality of horizontal patterns 100a and 100b. The horizontal patterns 100a and 100b may be provided in respective regions corresponding to the mat regions MTR of FIG. 3. For example, a memory structure MS on each of the horizontal patterns 100a and 100b may each correspond to a single mat region MTR. Alternatively, a pair of first horizontal patterns 100a adjacent to each other in the second direction D2 and the memory structures MS thereon may together constitute a first mat region MTR, and a pair of second horizontal patterns 100b adjacent to each other in the second direction D2 and the memory structures MS thereon may together constitute a second mat region MTR. In an exemplary embodiment, the first horizontal patterns 100a may share the peripheral circuit structure of FIG. 2, and the second horizontal patterns 100b may share another peripheral circuit structure.

The plurality of horizontal patterns 100a and 100b may be spaced apart from each other in the first direction D1 and/or the second direction D2. Hereinafter, regions which include the horizontal patterns 100a and 100b will be referred to as the mat regions MTR, and a region between the mat regions MTR will be referred to as a division region DV.

In an exemplary embodiment, one chip region 10 may include four or more mat regions MTR. As an example, one chip region 10 may include eight mat regions MTR. As shown in the exemplary embodiment of FIG. 4B, one chip region 10 may include four mat regions MTR.

In this exemplary embodiment, the scribe line region 20 described with reference to FIG. 1 may be formed in a region corresponding to an edge region of the chip, as shown in FIG. 4B, and thus, some structures may be removed near the edge region of the chip, unlike the structure of FIG. 4A. The description that follows will refer to an example of FIG. 4A.

Source structures SC, which are separated from each other, may be provided on each of the horizontal patterns 100a and 100b. For example, as shown in the exemplary embodiment of FIGS. 6-7, separated source structures SC may be disposed directly on the horizontal patterns 110a (e.g., in the third direction D3). The source structures SC may be parts of a memory structure, which will be described below. Each of the source structures SC may include protruding patterns PP, which protrude from the mat regions MTR and extend to the division region DV. The source structures SC may be separated from each other by the division structures DIT, which are provided in the division region DV and are interposed between the source structures SC. For example, the protruding patterns PP of the source structures SC from adjacent mat regions MTR may directly contact opposing lateral sides of a division structure DIT. An etch stop pattern ES may be provided in the division region DV. The etch stop pattern ES may be disposed below the division structures DIT (e.g., in the third direction D3). As shown in the exemplary embodiment of FIG. 4A, the etch stop pattern ES may include first sub-patterns ES1 extending in the first direction D1 and second sub-patterns ES2 extending in the second direction D2. The first sub-patterns ES1 may be extended along first edges EG1 of the horizontal patterns 100a and 100b, which are parallel to the first direction D1, and the second sub-patterns ES2 may be extended along second edges EG2 of the horizontal patterns 100a and 100b, which are parallel to the second direction D2. In an exemplary embodiment, the etch stop pattern ES may be a grid-shaped pattern, in which the first sub-patterns ES1 and the second sub-patterns ES2 are provided to cross each other.

Figure 6:
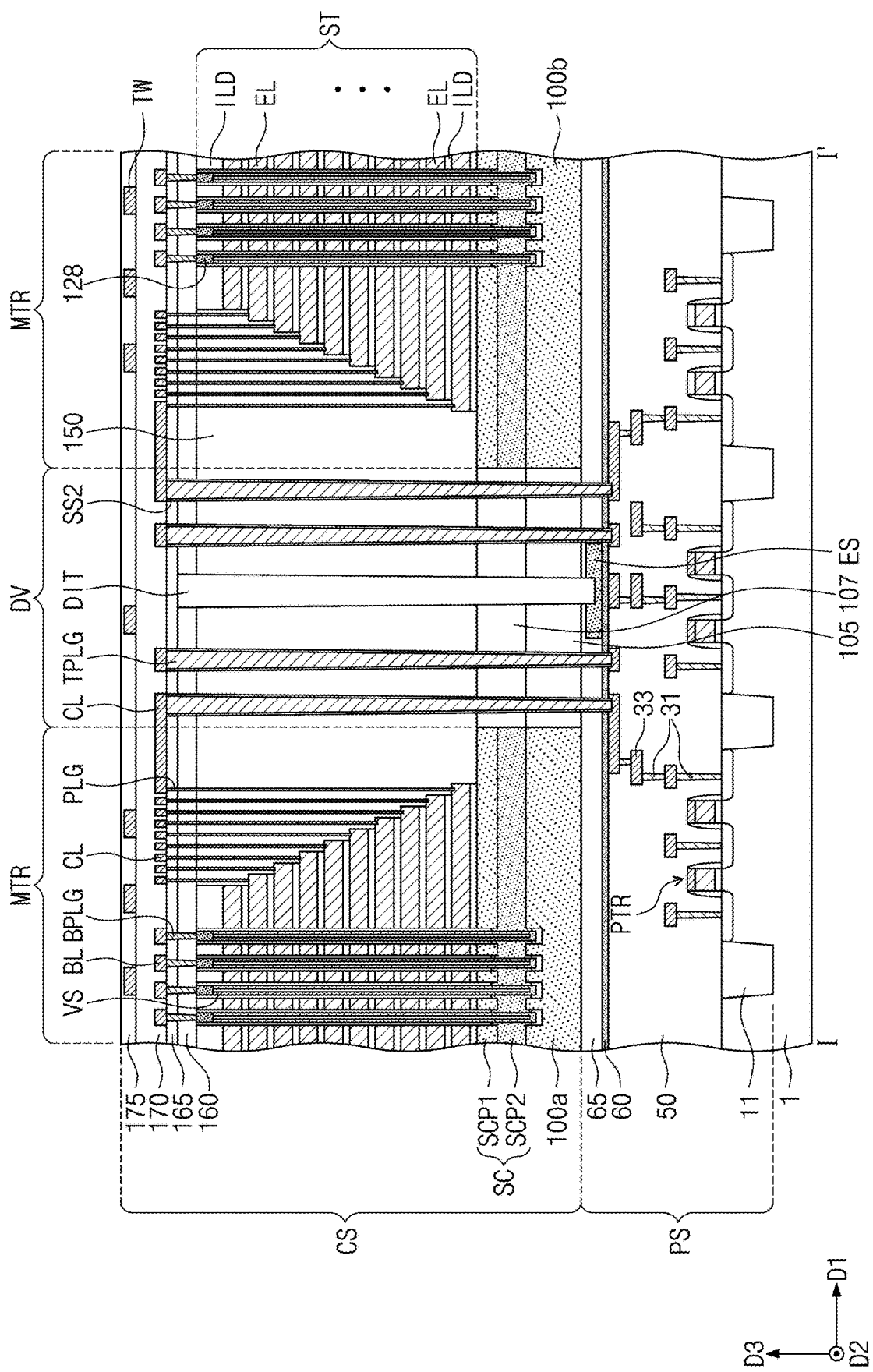
FIGS. 6 to 8 are cross-sectional views taken along lines I-I', II-II', and III-III' of FIG. 5, respectively, according to exemplary embodiments of the present inventive concepts.
Figure 7:
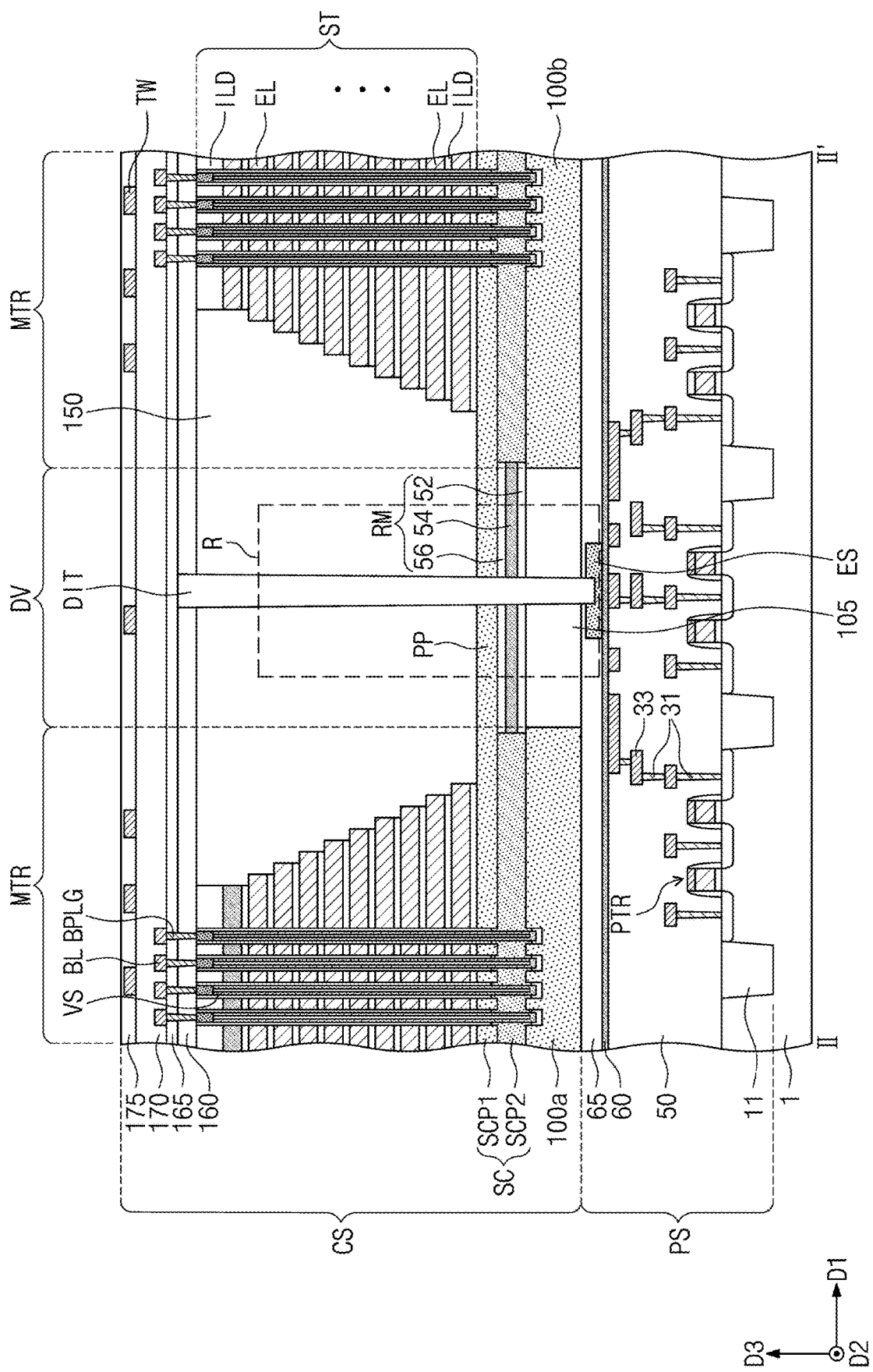
Figure 8:
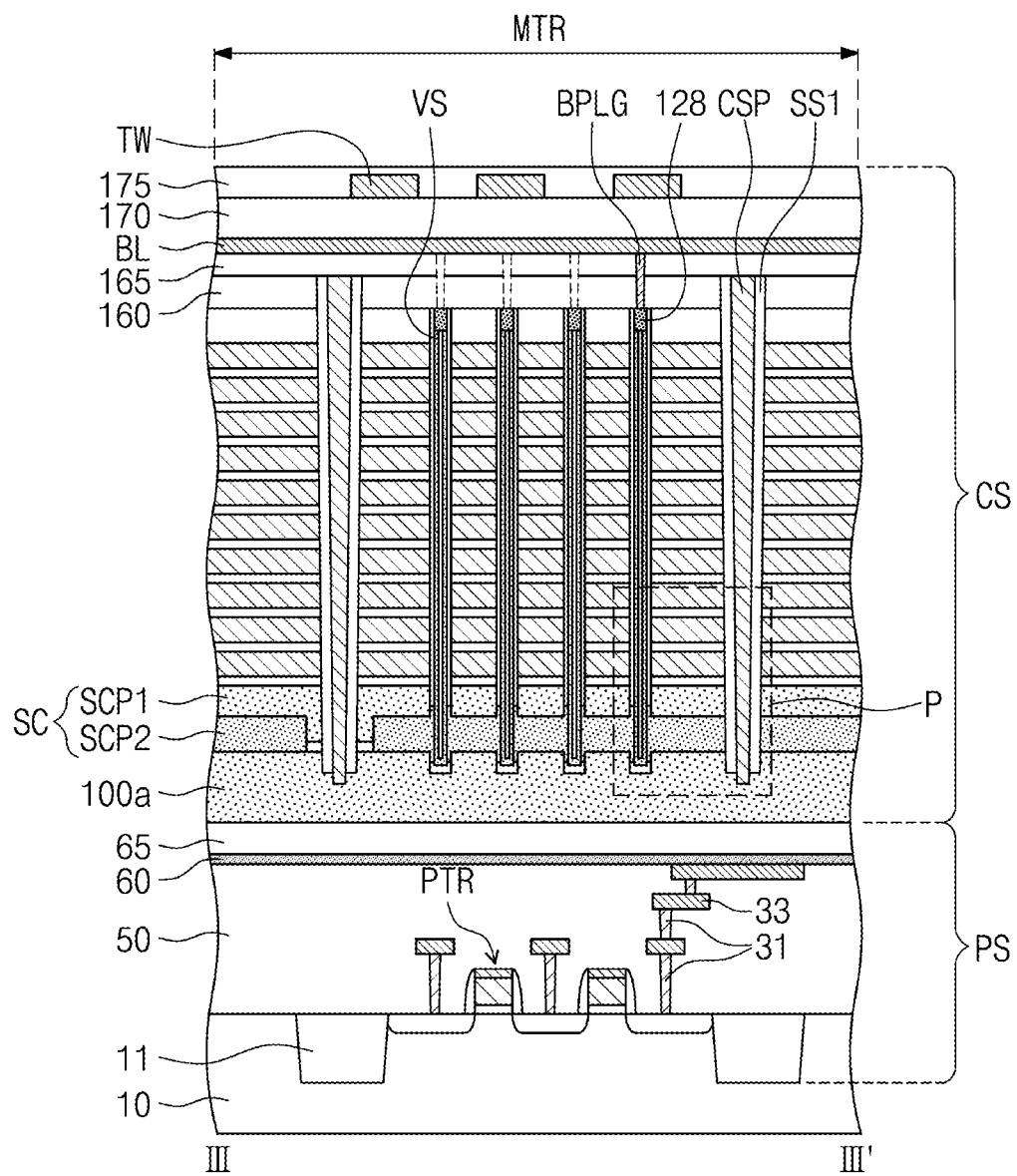
Figure 8:
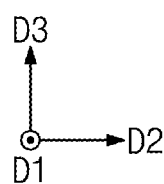
Figure 9A:
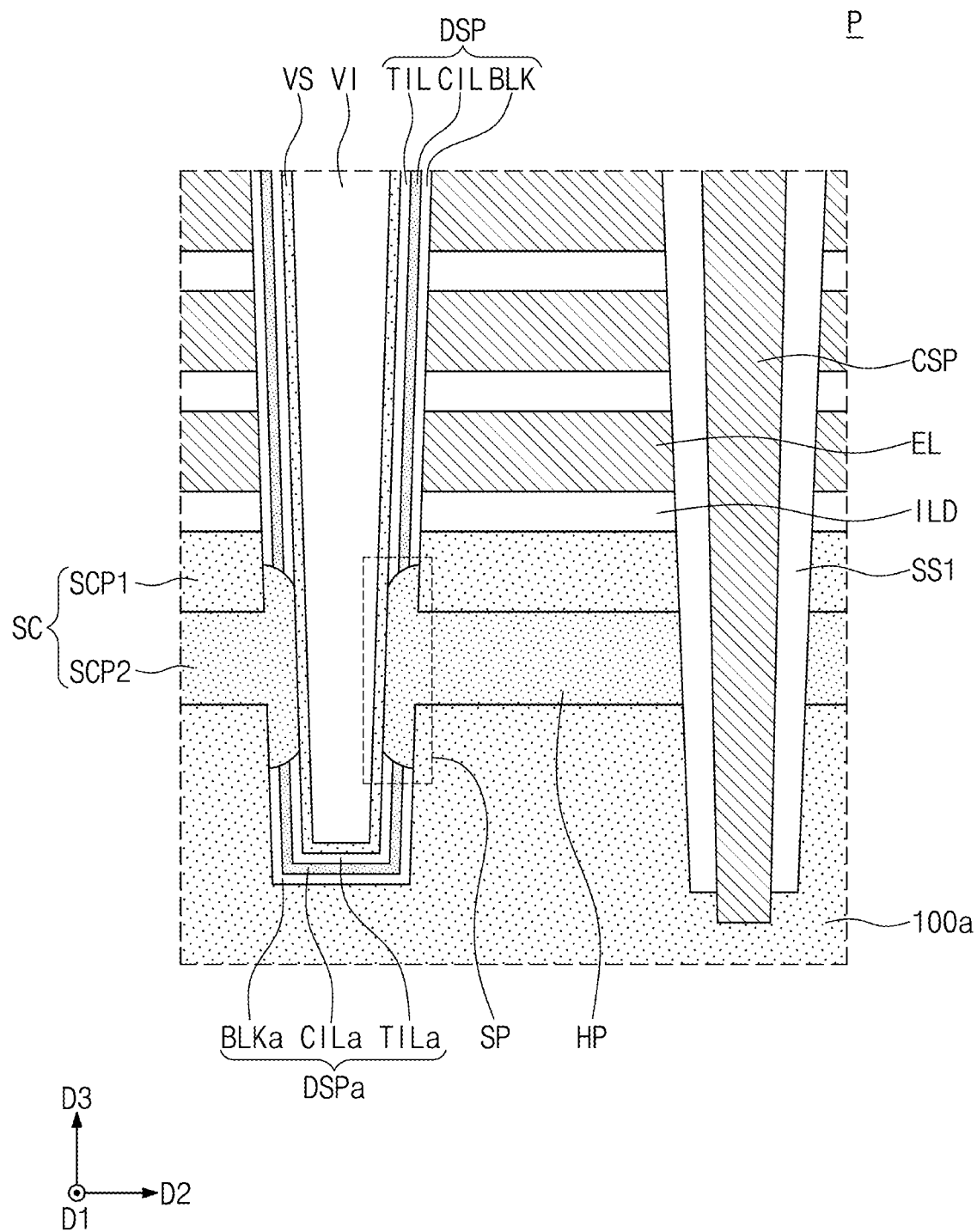
FIG. 9A is an enlarged cross-sectional view illustrating a portion 'P' of FIG. 8 according to an exemplary embodiment of the present inventive concepts.
Figure 9B:
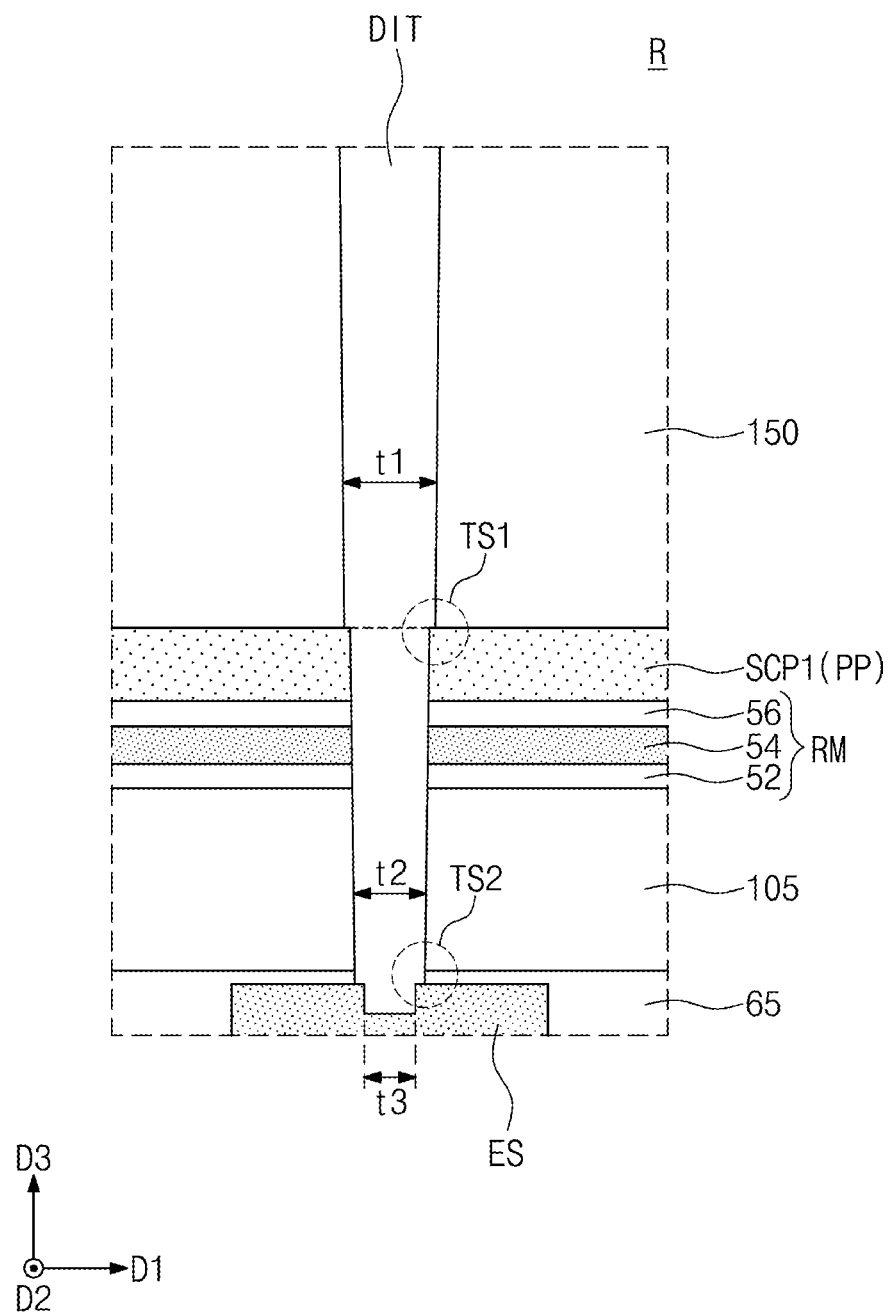
FIG. 9B is an enlarged cross-sectional view illustrating a portion 'R' of FIG. 7 according to an exemplary embodiment of the present inventive concepts.

FIGS. 6 to 8 are cross-sectional views taken along lines I-I' II-II', and III-III', respectively, of FIG. 5. FIG. 9A is an enlarged cross-sectional view illustrating a portion 'P' of FIG. 8. FIG. 9B is an enlarged cross-sectional view illustrating a portion 'R' of FIG. 7. Hereinafter, a three-dimensional semiconductor memory device according to exemplary embodiments of the present inventive concepts will be described in more detail with reference to FIGS. 4A, 5 to 8, 9A, and 9B.

Referring to FIGS. 4A, 5 to 8, 9A, and 9B, the peripheral circuit structure PS including peripheral logic circuits PTR may be disposed on the semiconductor substrate 1, and the cell array structure CS may be disposed on the peripheral circuit structure PS. The peripheral circuit structure PS may include the peripheral logic circuits PTR, which are integrated on the semiconductor substrate 1, and a lower interlayered insulating layer 50, which is provided to cover the peripheral logic circuits PTR.

In an exemplary embodiment, the semiconductor substrate 1 may be a silicon wafer, a silicon-germanium wafer, a germanium wafer, or a single-crystalline epitaxial layer grown on a single-crystalline silicon wafer.

The peripheral logic circuits PTR may be the row and column decoders, the page buffer, and the control circuit, as described above. The peripheral logic circuits PTR may include NMOS and PMOS transistors, low and high voltage transistors, and resistors, which are integrated on the semiconductor substrate 1. Peripheral circuit lines 33 may be electrically connected to the peripheral logic circuits PTR through peripheral contact plugs 31. For example, the peripheral contact plugs 31 and the peripheral circuit lines 33 may be coupled to the NMOS and PMOS transistors.

The lower interlayered insulating layer 50 may cover the peripheral logic circuits PTR, the peripheral contact plugs 31, and the peripheral circuit lines 33. In an exemplary embodiment, the lower interlayered insulating layer 50 may include a plurality of insulating layers, which are stacked. For example, the lower interlayered insulating layer 50 may include at least one layer selected from a silicon oxide layer, a silicon nitride layer, a silicon oxynitride layer, and a low-k dielectric layer.

The etch stop layer 60 and an intermediate interlayered insulating layer 65 may be sequentially stacked on the lower interlayered insulating layer 50. For example, as shown in the exemplary embodiment of FIG. 6, the bottom surface of the etch stop layer 60 may directly contact a top surface of the lower interlayered insulating layer 50. A bottom surface of the intermediate interlayered insulating layer 65 may directly contact a top surface of the etch stop layer 60. In an exemplary embodiment, the etch stop layer 60 may be formed of, or include, an insulating material having an etch selectivity with respect to the lower interlayered insulating layer 50. For example, the etch stop layer 60 may include a silicon nitride layer or a silicon oxynitride layer. However, exemplary embodiments of the present inventive concepts are not limited thereto. In an exemplary embodiment, the intermediate interlayered insulating layer 65 may be formed of, or include, the same material as the lower interlayered insulating layer 50.

The cell array structure CS may include the mat regions MTR, which are provided on the horizontal patterns 100a and 100b, respectively, and the division region DV, which is provided between the mat regions MTR (e.g., in the first direction D1). Each of the mat regions MTR may include electrode structures ST and vertical structures VS penetrating the electrode structures ST. The electrode structures ST may include a cell array region CAR and a connection region CNR, as shown in FIG. 5. For example, as shown in the exemplary embodiment of FIG. 5, the cell array region CAR and the connection region CNR may be spaced apart in the first direction D1. The connection region CNR may be adjacent to the division region DV in the first direction D1.

The horizontal patterns 100a and 100b may be disposed on the intermediate interlayered insulating layer 65. For example, as shown in the exemplary embodiment of FIG. 6, the horizontal patterns 100a, 100b may be disposed directly on the intermediate interlayered insulating layer 65 (e.g., in the third direction D3). In an exemplary embodiment, the horizontal patterns 100a and 100b may be formed of or include at least one semiconductor material, such as silicon (Si), germanium (Ge), silicon germanium (SiGe), gallium arsenic (GaAs), indium gallium arsenic (InGaAs), aluminum gallium arsenic (AlGaAs), or combinations thereof. The horizontal patterns 100a and 100b may have at least one of a single crystalline structure, an amorphous structure, and a polycrystalline structure. As an example, the horizontal patterns 100a and 100b may be formed of a poly-silicon layer doped with n-type impurities. The horizontal patterns 100a and 100b may further include a metal layer. The horizontal patterns 100a and 100b may be provided on the cell array region CAR and the connection region CNR. A first insulating penetration layer 105 may be provided in the division region DV between the horizontal patterns 100a and 100b (e.g., in the first direction D1). In an exemplary embodiment, the first insulating penetration layer 105 may be formed of or include silicon oxide.

Each of the electrode structures ST may include insulating layers ILD and electrodes EL, which are alternately stacked in the third direction D3 (e.g., a vertical direction) perpendicular to the first and second directions D1 and D2. In each of the electrode structures ST, the electrodes EL may have a staircase structure in an edge region of the mat region MTR (e.g., in the connection region CNR).

The electrodes EL of each electrode structure ST may have a decreasing length (e.g., a length in the first direction D1 extending towards the division region DV) with increasing distance from the horizontal pattern 100a or 100b. Each of the electrodes EL may have pad portions which are located at the end closest to the division region DV, and the pad portion of each of the electrodes EL may be exposed by another electrode directly located thereon having the decreasing length (e.g., in the first direction D1). The pad portions of the electrodes EL may be located at different positions, in horizontal and vertical directions. In an exemplary embodiment, the electrodes EL may be formed of or include at least one conductive material, such as doped semiconductor materials, metal silicides, metallic materials, metal nitrides, etc. The insulating layers ILD may be formed of or include silicon oxide. However, exemplary embodiments of the present inventive concepts are not limited thereto.

The vertical structures VS may be provided to penetrate the electrode structure ST in each mat region MTR and may be connected to the horizontal patterns 100a and 100b. The vertical structures VS may be arranged in a specific direction or may be arranged in a zigzag shape, when viewed in a plan view. For example, the vertical structures VS may extend in the third direction D3 to the horizontal patterns 100a, 100b and may penetrate the electrodes of the electrode structure ST which extend in the first direction D1. The vertical structures VS may include a semiconductor material, such as silicon (Si), germanium (Ge), or combinations thereof. In an exemplary embodiment, the vertical structures VS may be formed of or include a doped semiconductor material or an intrinsic semiconductor material. The vertical structures VS including the semiconductor material may be used as channel regions of transistors constituting NAND cell strings. Gapfill patterns VI may be provided to fill internal spaces of the vertical structures VS. The gapfill patterns VI may be formed of or include, for example, silicon oxide. Contact pads 128 may be provided on or in upper portions of the vertical structures VS. The contact pads 128 may be formed of or include, for example, doped poly silicon.

The source structure SC may be provided between the electrode structure ST and the horizontal patterns 100a and 100b (e.g., in the third direction D3). The source structure SC may include first and second conductive source patterns SCP1 and SCP2. As shown in the exemplary embodiment of FIG. 6, bottom surfaces of the second conductive source patterns SCP2 may be in contact with top surfaces of the horizontal patterns 100a and 100b. Bottom surfaces of the first conductive source patterns SCP1 may be in contact with top surfaces of the second conductive source patterns SCP2.

In an exemplary embodiment, the first and second conductive source patterns SCP1 and SCP2 may be formed of or include a doped semiconductor material which is doped with different dopants, such as phosphorus (P) or arsenic (As), from those in the semiconductor substrate 1 and thus has a second conductivity type different from the conductivity of the semiconductor substrate 1. In an exemplary embodiment, the first and second conductive source patterns SCP1 and SCP2 may be formed of an n-type doped polysilicon layer. In this exemplary embodiment, a concentration of n-type dopants may be higher in the second conductive source pattern SCP2 than in the first conductive source pattern SCP1. Sidewalls of the second conductive source patterns SCP2 may be provided on the horizontal patterns 100a and 100b, and sidewalls of the first conductive source patterns SCP1 may be in direct contact with sidewalls of division structures, which will be described below.

The second conductive source patterns SCP2 may be in direct contact with portions of the sidewalls of the vertical structures VS. For example, as shown in the exemplary embodiments of FIGS. 9A and 9B, the second conductive source patterns SCP2 may include a sidewall portion SP, which is in contact with the vertical structures VS and encloses portions of the sidewalls of the vertical structures VS. For example, as shown in the exemplary embodiment of FIG. 9A, the sidewall portion SP may include lateral ends which extend in the third direction D3 that directly contact outer wall surfaces of the vertical structures VS. The second conductive source patterns SCP2 may further include a horizontal portion HP, which may extend in the second direction D2 and is provided below the electrode structure ST (e.g., in the third direction D3). In the second conductive source patterns SCP2, a top surface of the horizontal portion HP may be in contact with bottom surfaces of the first conductive source patterns SCP1. The sidewall portion SP of the second conductive source patterns SCP2 may have a larger width (e.g., length in the third direction D3) than the width of the horizontal portion HP and may extend to cover portions of sidewalls (e.g., sidewalls extending in the third direction D3) of the first conductive source patterns SCP1 and portions of sidewalls (e.g., sidewalls extending in the third direction D3) of the horizontal patterns 100a and 100b. At least one of the electrodes EL adjacent to the source structure SC (e.g., adjacent in the third direction D3) may serve as an erase control gate electrode, and an electrode directly disposed on the erase control gate electrode (e.g., disposed directly above the insulating layer ILD disposed on the erase control gate electrode in the third direction D3) may serve as a ground selection gate electrode.

The protruding patterns PP protrude (e.g., in the first direction D1) from the source structure SC to the division region DV. In an exemplary embodiment, the protruding patterns PP may be portions of the first conductive source patterns SCP1 which extend within the division region DV. In an exemplary embodiment, the second conductive source patterns SCP2 may not be extended to the division region DV. For example, the second conductive source patterns SCP2 may terminate at or in proximity to the edge of the mat region MTR adjacent to the division region DV. Remaining mold patterns RM may be provided between the protruding patterns PP and the first insulating penetration layer 105 (e.g., in the third direction D3). For example, as shown in the exemplary embodiment of FIG. 9B, the remaining mold patterns RM may include first to third remaining sacrificial patterns 52, 54, and 56. The first to third remaining sacrificial patterns 52, 54, 56 may be directly stacked on each other (e.g., in the third direction D3). The first remaining sacrificial pattern 52 may be disposed directly on the first insulation penetration layer 105 (e.g., in the third direction D3). The protruding patterns PP may be disposed directly on the third remaining sacrificial pattern 56 (e.g., in the third direction D3). The second remaining sacrificial pattern 54 may be disposed between the first remaining sacrificial pattern 52 and the third remaining sacrificial pattern 56 (e.g., in the third direction D3). In an exemplary embodiment, the first and third remaining sacrificial patterns 52 and 56 may be formed of or include silicon oxide. The second remaining sacrificial pattern 54 may be formed of or include silicon nitride or poly silicon. The remaining mold patterns RM may be disposed at the same level (e.g., distance from the substrate 1 in the third direction D3) as the level of the second conductive source patterns SCP2 in the mat region MTR. Top surfaces of the remaining mold patterns RM (e.g., a top surface of the third remaining sacrificial patterns 56) may be in contact with the bottom surfaces of the first conductive source patterns SCPI.

A second insulating penetration layer 107 may be provided in a region between adjacent source structures SC. For example, as shown in the exemplary embodiment of FIG. 6, the second insulating penetration layer 107 may be formed in the division region DV directly between source structures SC (e.g., in the first direction D1) in adjacent mat regions MTR. As shown in the exemplary embodiment of FIG. 6, the second insulating penetration layer 107 may have the same width (e.g., length in the third direction D3) as the adjacent source structures SC. In an exemplary embodiment, the second insulating penetration layer 107 may be formed of or include, for example, silicon oxide. The second insulating penetration layer 107 may fill a region, in which the protruding patterns PP protruding from the source structures SC to the division region DV are not provided.

As shown in the exemplary embodiment of FIG. 9A, a data storage pattern DSP may be provided between the electrode structure ST and the vertical structures VS. The data storage pattern DSP may be extended in the third direction D3 to enclose a sidewall (e.g., an inner sidewall) of each vertical structure VS. For example, in an exemplary embodiment, the data storage pattern DSP may be a pipe-shape pattern having an open top and bottom. A bottom surface of the data storage pattern DSP may be in direct contact with the sidewall portion SP of the second conductive source pattern SCP2. For example, as shown in the exemplary embodiment of FIG. 9A, the bottom surface of the data storage pattern DSP may directly contact a top edge (e.g., in the third direction D3) of the sidewall portion SP. In an exemplary embodiment, a lower portion of the data storage pattern DSP may be disposed between the vertical structure VS and the first conductive source pattern SCP1 (e.g., in the second direction D2).

The data storage pattern DSP may be composed of one or more layers. In an exemplary embodiment, the data storage pattern DSP may be a part of a data storing layer. For example, as shown in the exemplary embodiment of FIG. 9A, the data storage pattern DSP may include a tunnel insulating layer TIL, a charge storing layer CIL, and a blocking insulating layer BLK, which are sequentially stacked on the sidewall of the vertical structure VS to serve as the data storing layer of a NAND flash memory device. In an exemplary embodiment, the charge storing layer CIL may be a trap insulating layer, a floating gate electrode, or an insulating layer with conductive nano dots. In an exemplary embodiment, the charge storing layer CIL may include at least one of a silicon nitride layer, a silicon oxynitride layer, a silicon-rich nitride layer, a nanocrystalline silicon layer, or a laminated trap layer. The tunnel insulating layer TIL may be formed of at least one materials having band gaps that are greater than the band gaps of the charge storing layer CIL, and the blocking insulating layer BLK may be formed of a high-k dielectric material (e.g., aluminum oxide, hafnium oxide, etc.).

According to an exemplary embodiment of the present inventive concepts, a dummy data storage pattern DSPa may be disposed in the horizontal patterns 100a and 100b and may be vertically spaced apart from the data storage pattern DSP with the sidewall portion SP therebetween (e.g., in the third direction D3). The dummy data storage pattern DSPa may have substantially a 'U'-shaped section. The dummy data storage pattern DSPa may be disposed between a bottom surface of the vertical structure VS and the horizontal patterns 100a and 100b. For example, as shown in the exemplary embodiment of FIG. 9A, a top surface of the dummy data storage pattern DSPa may be in direct contact with a bottom edge of the sidewall portion SP of the second conductive source pattern SCP2. The horizontal patterns 100a and 100b may surround the dummy storage pattern DSPa in the second direction D2 and the third direction D3. The dummy data storage pattern DSPa may have substantially the same layer structure as the data storage pattern DSP. For example, the dummy data storage pattern DSPa may include a tunnel insulating layer TILa, a charge storing layer CILa, and a blocking insulating layer BLKa, which are sequentially stacked.

In an exemplary embodiment, the three-dimensional semiconductor memory device may be a three-dimensional NAND flash memory device and may include NAND cell strings integrated on the horizontal patterns 100a and 100b. In other words, the electrode structure ST, the vertical structures VS, and the data storage pattern DSP may constitute memory cells, which are three-dimensionally arranged on the horizontal patterns 100a and 100b.

An upper interlayered insulating layer 150 may cover end portions of the electrodes EL, which are disposed to form the staircase structure, and may cover the horizontal patterns 100a and 100b, the second insulating penetration layer 107, and the protruding patterns PP. A first interlayered insulating layer 160 may be provided on the upper interlayered insulating layer 150 to cover top surfaces of the vertical structures VS.

As shown in FIGS. 8 and 9A, a common source electrode CSP may penetrate the electrode structure ST in the third direction D3, may be extended in the first direction D1, and may be connected to the horizontal patterns 100a and 100b. The common source electrode CSP may penetrate the entirety of the source structure SC in the third direction D3 and may then extend to the horizontal patterns 100a and 100b. A first insulating spacer SS1 may be interposed between the common source electrode CSP and the electrode structures ST (e.g., in the second direction D2). In an exemplary embodiment, the first insulating spacer SS1 may be formed of or include silicon oxide.

In the division region DV, the division structures DIT may be provided between the protruding patterns PP of adjacent source structures SC. In an exemplary embodiment, the division structures DIT may have a bar or rectangular shape. As shown in FIG. 5, a width w1 of the division structures DIT in the second direction D2 may be larger than a width w2 of the protruding pattern PP. In an exemplary embodiment, the division structures DIT may be formed of or include at least one of silicon oxide, silicon nitride, or silicon oxynitride. As shown in FIG. 4A, the division structures DIT may be disposed adjacent to four edges of each of the horizontal patterns 100a and 100b. However, exemplary embodiments of the present inventive concepts are not limited thereto.

As shown in FIG. 9B, a width (e.g., a distance in the first direction D1 between lateral side surfaces) of the division structure DIT may vary depending on the layer that the division structure DIT is in contact therewith. For example, the division structure DIT may have a first width t1 at a level of the upper interlayered insulating layer 150 and may have a second width t2, which is smaller than the first width t1, at a level of the first conductive source patterns SCP1. Furthermore, the division structure DIT may have a third width t3, which is smaller than the second width t2, at a level of the etch stop pattern ES. In an exemplary embodiment, the division structures DIT may have a first staircase structure TS1 at or near an interface between the upper interlayered insulating layer 150 and the first conductive source patterns SCP1 and may have a second staircase structure TS2 at or near an interface between the intermediate interlayered insulating layer 65 and the etch stop pattern ES.

The etch stop pattern ES, which is connected to a lower portion of the division structure DIT, may be provided between the peripheral circuit structure PS and the source structure SC. As shown in the exemplary embodiment of FIGS. 7 and 9B, top surfaces of the etch stop pattern ES may be positioned at a lower level than bottom surfaces of the horizontal patterns 100a and 100b. For example, the etch stop pattern ES may be disposed in the intermediate interlayered insulating layer 65 and the intermediate interlayered insulating layer 65 may cover top and side surfaces of the etch stop pattern ES. In an exemplary embodiment, the etch stop pattern ES may be formed of or include a material, which is selected to have an etch selectivity with respect to the insulating layers ILD and sacrificial layers, which will be described below. For example, the etch stop pattern ES may be formed of or include a material having an etch selectivity with respect to silicon oxide and silicon nitride. The etch stop pattern ES may be formed of non-metallic elements (e.g., a substantially metal-free material). As an example, the etch stop pattern ES may include a semiconductor material, such as poly silicon. The etch stop pattern ES may not be electrically connected to neighboring interconnection lines and contacts and may be in an electrically isolated state.

As shown in the exemplary embodiment of FIG. 5, a width w4 of the etch stop pattern ES in the first direction D1 may be larger than a width w3 of the division structure DIT in the first direction D1. As shown in the exemplary embodiment of FIG. 4A, the etch stop pattern ES may include the first sub-patterns ES1 extending in the first direction D1 and the second sub-patterns ES2 extending in the second direction D2. In an exemplary embodiment, the etch stop pattern ES may be thinner (e.g., length in the first direction D1) than the horizontal patterns 100a and 100b. In an exemplary embodiment, a thickness of the etch stop pattern ES may be about ⅙ to ½ times a thickness of the horizontal patterns 100a and 100b. For example, in an exemplary embodiment, the thickness of the etch stop pattern ES may range from about 800 Å to about 2000 Å. In another exemplary embodiment, the thickness of the etch stop pattern ES may range from about 1100 Å to about 1700 Å. In an exemplary embodiment, the thickness of the horizontal patterns 100a and 100b may range from about 3000 Å to about 7000 Å. In another exemplary embodiment, the thickness of the horizontal patterns 100a and 100b may range from about 4500 Å to about 5500 Å. The etch stop pattern ES may be thicker than the etch stop layer 60. In an exemplary embodiment, the thickness of the etch stop pattern ES may be about 10 to 90 times a thickness of the etch stop layer 60.

A second interlayered insulating layer 165, a third interlayered insulating layer 170, and a fourth interlayered insulating layer 175 may be sequentially stacked on the first interlayered insulating layer 160. As shown in the exemplary embodiment of FIG. 3, cell contact plugs PLG may extend vertically (e.g., in the third direction D3) and may penetrate the first and second interlayered insulating layers 160 and 165 and the upper interlayered insulating layer 150 and may be respectively coupled to end portions of the electrodes EL. Bit lines BL may be disposed on the second interlayered insulating layer 165 to cross the electrode structures ST and to extend in the second direction D2. The bit line BL may be electrically connected to the vertical structure VS through a bit line contact plug BPLG that extends through the first and second interlayered insulating layers 160 and 165. The third interlayered insulating layer 170 may cover the bit lines BL. Upper interconnection lines TW may be disposed on the third interlayered insulating layer 170. For example, as shown in the exemplary embodiment of FIG. 6, bottom portions of the upper interconnection lines TW may directly contact a top portion of the third interlayered insulating layer 170. The upper interconnection lines TW may be connected to the bit lines BL or connection lines CL through via plugs. In an exemplary embodiment, at least one of the first to fourth interlayered insulating layers 160, 165, 170, and 175 may be formed of or include silicon oxide.

A penetration plug region TVS includes a plurality of penetration plugs TPLG. The penetration plugs TPLG may extend vertically (e.g., in the third direction D3) to penetrate the first and second interlayered insulating layers 160 and 165, the upper interlayered insulating layer 150, the first and second insulating penetration layers 105 and 107, the intermediate interlayered insulating layer 65, and the etch stop layer 60 and may be coupled to the peripheral circuit lines 33. Each of the penetration plugs TPLG may be surrounded by a second insulating spacer SS2, which is formed of an insulating material. The penetration plugs TPLG may be connected to the cell contact plugs PLG, respectively, through the connection lines CL on the second interlayered insulating layer 165 which may extend from the mat region with to the penetration plug TPLG (e.g., in the first direction D1). The penetration plugs TPLG may electrically connect the electrodes EL of the electrode structures ST to the peripheral circuit lines 33. The penetration plugs TPLG, the cell contact plugs PLG, and the bit line contact plug BPLG may be formed of or include at least one of metallic material (e.g., tungsten, aluminum, etc). The penetration plugs TPLG may be horizontally spaced apart (e.g., in the first direction D1) from the etch stop pattern ES and the division structure DIT. In an exemplary embodiment, a bottom surface of the division structure DIT may be positioned at a level higher than bottom surfaces of the penetration plugs TPLG. Bottom surfaces of the vertical structures VS may be positioned at a level higher than the bottom surface of the division structure DIT. In an exemplary embodiment, the bottom surface of the division structure DIT may be placed between the bottom surfaces of the penetration plugs TPLG and the bottom surfaces of the vertical structures VS.

As shown in the exemplary embodiments of FIG. 5, the penetration plug region TVS may be disposed in a portion of the division region DV, in which the etch stop pattern ES and the source structure SC are not provided, as shown in FIG. 5. However, exemplary embodiments of the present inventive concepts are not limited thereto. For example, in some exemplary embodiments, the penetration plug region TVS may be provided in the connection region CNR or the cell array region CAR in the mat region MTR.

Figure 10:
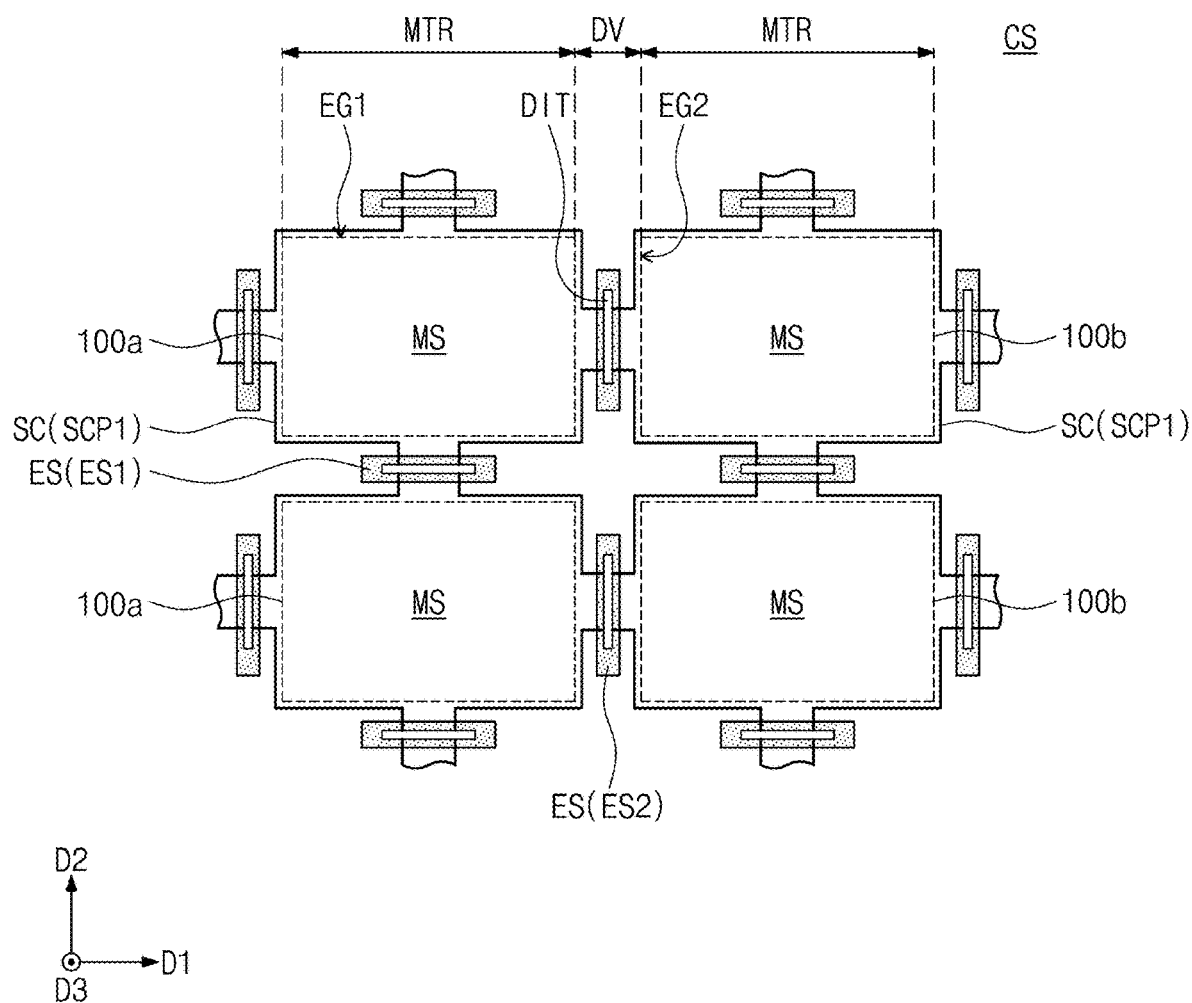
FIGS. 10 to 12 are top plan views illustrating cell array structures of a three-dimensional semiconductor memory device according to exemplary embodiments of the present inventive concepts.
Figure 11:
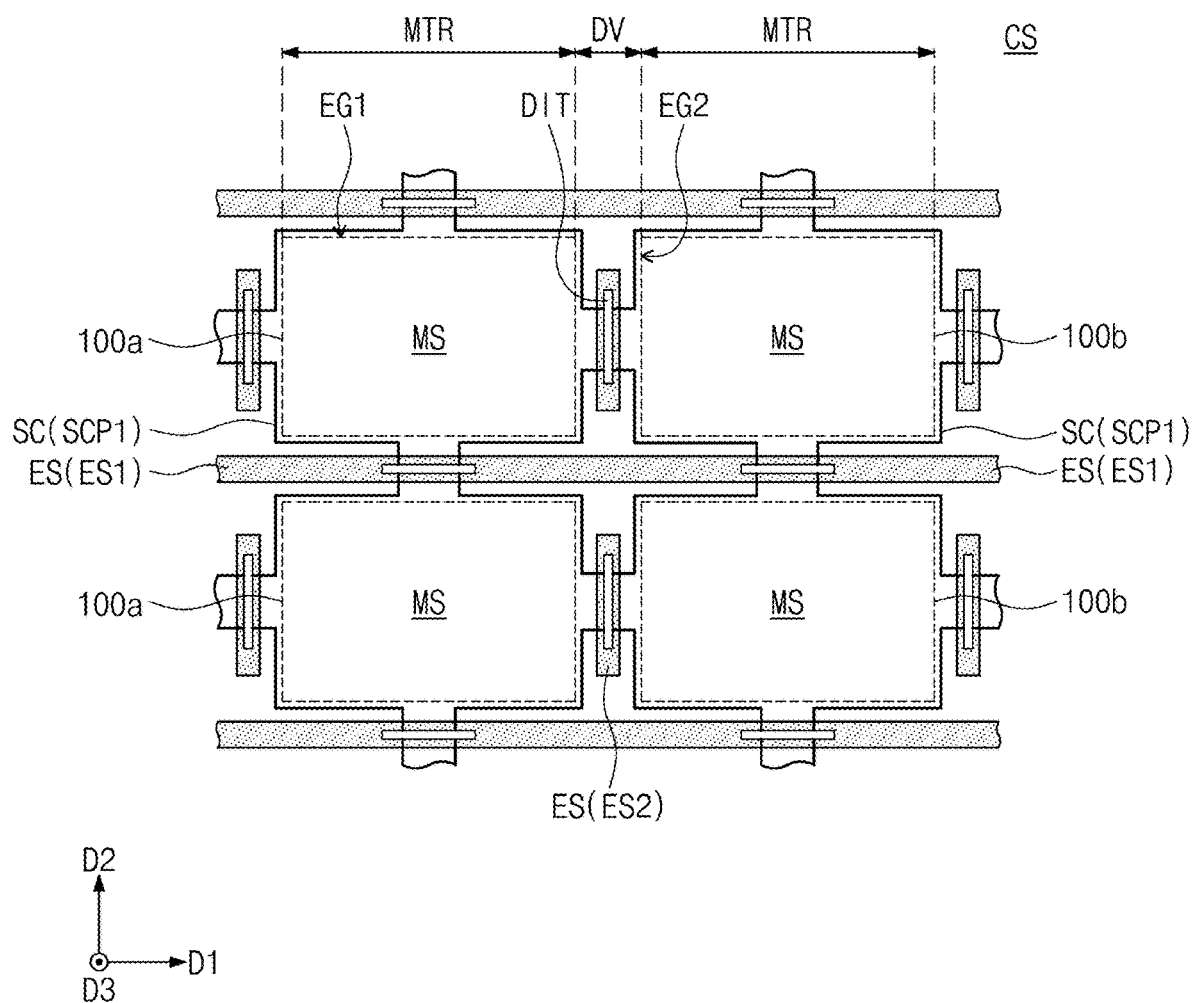
Figure 12:
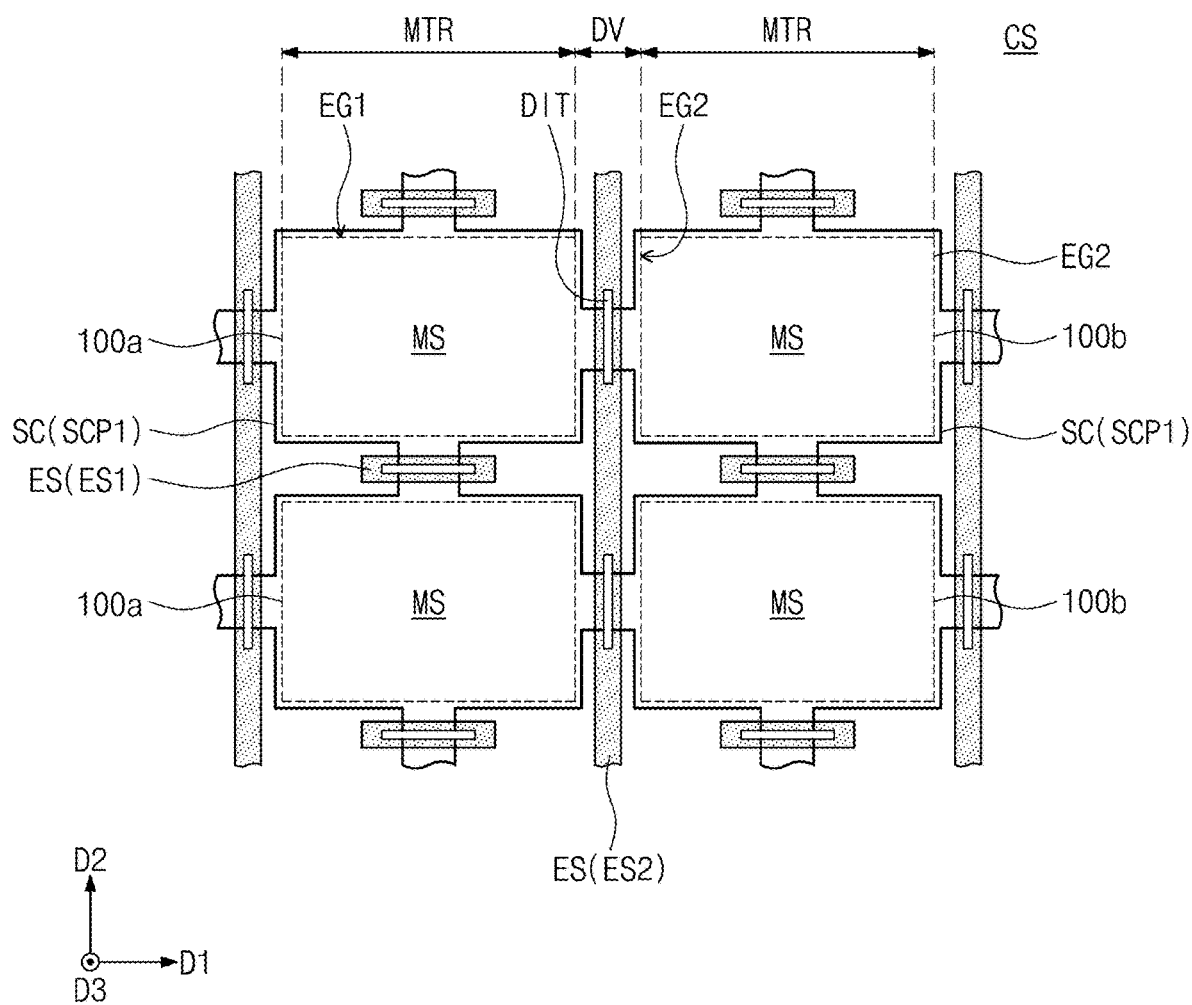

FIGS. 10 to 12 are top plan views, each of which schematically illustrates a cell array structure of a three-dimensional semiconductor memory device according to exemplary embodiments of the present inventive concept. For concise description, a previously described element may be identified by the same reference number without repeating an overlapping description thereof.

As shown in FIGS. 10 to 12, the etch stop pattern ES may be provided in various shapes. FIG. 10 shows an island type of the etch stop pattern ES, in which all of the first and second sub-patterns ES1 and ES2 extending in the first and second directions D1 and D2 are spaced apart from each other. Alternatively, FIGS. 11 and 12 show two structures of the etch stop pattern ES, in which one of the first sub-patterns ES1 and the second sub-patterns ES2 has a line shape. For example, in the exemplary embodiment shown in FIG. 11, the first sub-pattern ES has a line shape and extends continuously in the first direction D1. The second sub-pattern ES2 has an island configuration in which each second sub-pattern is separated from each other (e.g., in the first direction D1 and/or second direction D2). In the exemplary embodiment of FIG. 12, the second sub-pattern ES2 has a line shape and extends continuously in the second direction D2 and the first sub-pattern ES1 has an island configuration in which each sub-pattern is separated from each other (e.g., in the first direction D1 and/or second direction D2). However, exemplary embodiments of the present inventive concepts are not limited to these example structures of the etch stop pattern ES, and the structure of the etch stop pattern ES may be variously changed depending on the arrangement and shapes of the division structures DIT.

Figure 13:
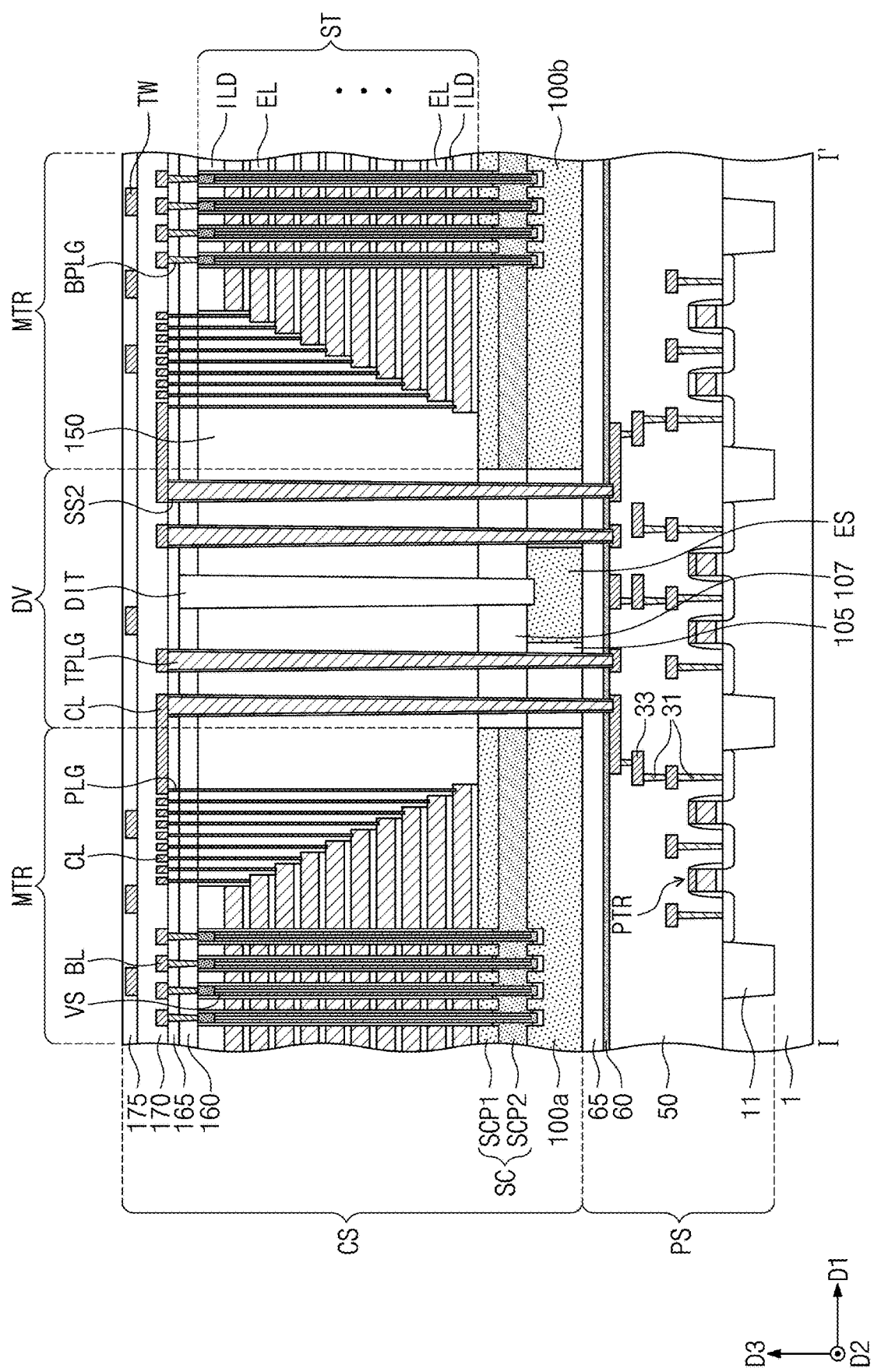
FIGS. 13 and 14 are cross-sectional views of a three-dimensional semiconductor memory device taken along the lines I-I' and II-II' of FIG. 5, respectively, according to exemplary embodiments of the present inventive concepts.
Figure 14:
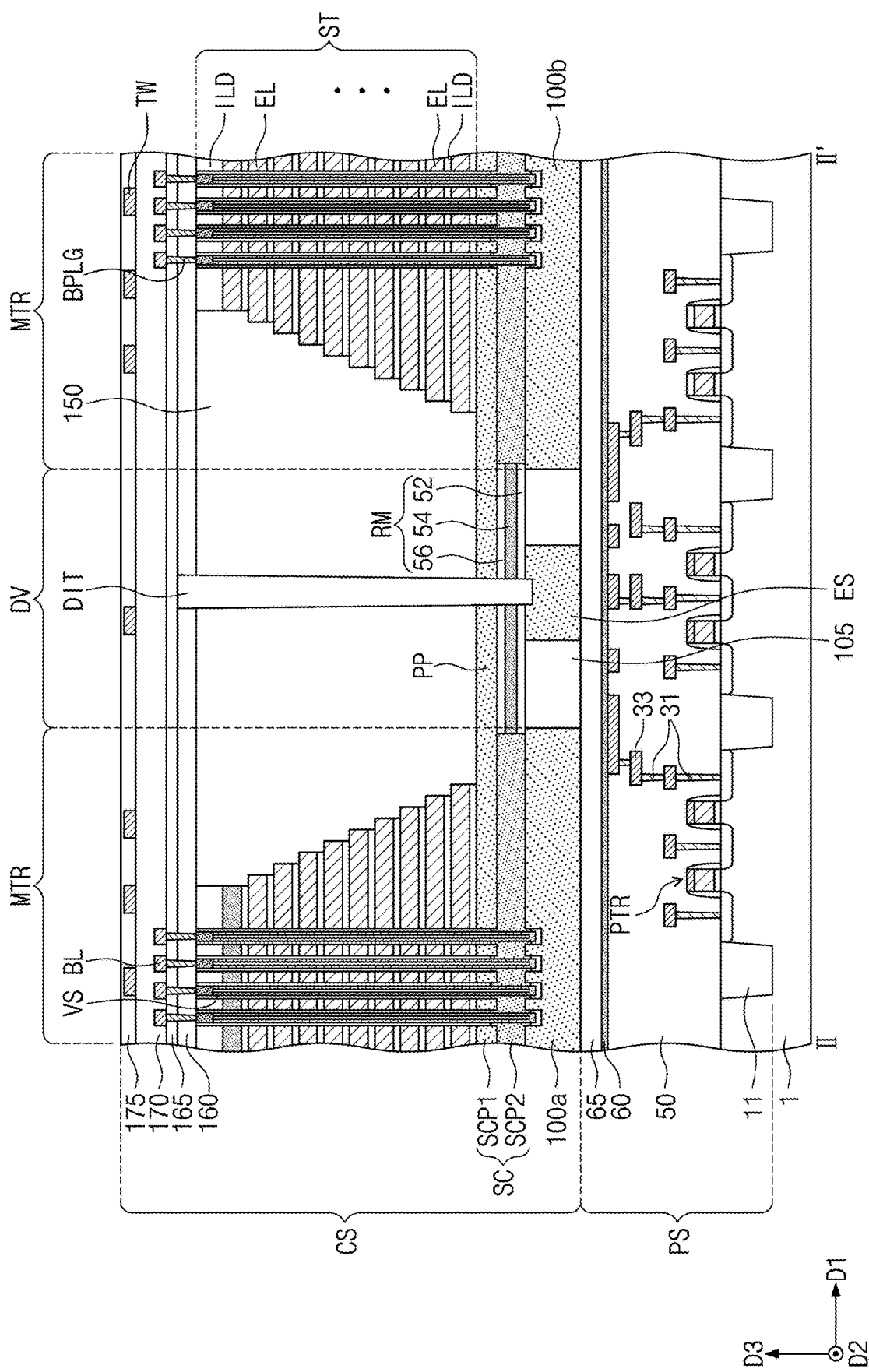

FIGS. 13 and 14 are cross-sectional views, which are taken along the lines I-I' and II-II' respectively, of FIG. 5 to illustrate a three-dimensional semiconductor memory device according to exemplary embodiments of the present inventive concepts. For concise description, a previously described element may be identified by the same reference number without repeating an overlapping description thereof.

Referring to FIGS. 13 and 14, the etch stop pattern ES, which is connected to a lower portion of the division structure DIT, may be provided between the peripheral circuit structure PS and the source structure SC. In the exemplary embodiments shown in FIGS. 13 and 14, the etch stop pattern ES may be disposed at the same level as the horizontal patterns 100a and 100b. For example, the etch stop pattern ES may have a top surface, which is located at the same level as the top surfaces of the horizontal patterns 100a and 100b, and may have a bottom surface, which is located at the same level as the bottom surfaces of the horizontal patterns 100a and 100b. A bottom surface of the etch stop pattern ES may be disposed on a top surface of the intermediate interlayered insulating layer 65 (e.g., in the third direction D3) as compared to the exemplary embodiment of FIG. 6, in which the etch stop pattern ES is disposed directly on a top surface of the etch stop layer 60 and the intermediate interlayered insulating layer 65 covers the top and side surfaces of the etch stop pattern ES. In an exemplary embodiment, the etch stop pattern ES and the horizontal patterns 100a and 100b may be concurrently formed using the same material and may be patterned to form separate patterns from each other. In an exemplary embodiment, the etch stop pattern ES may have the same thickness (e.g., length in the third direction D3) as the horizontal patterns 100a and 100b. For example, the thicknesses of the etch stop pattern ES and the horizontal patterns 100a and 100b may range from about 3000 Å to about 7000 Å.

FIGS. 15, 18, 21, and 24 are cross-sectional views, which are taken along the line I-I' of FIG. 5 to illustrate a method of fabricating a three-dimensional semiconductor memory device, according to exemplary embodiments of the present inventive concept. FIGS. 16, 19, 22, and 25 are cross-sectional views taken along the line II-II' of FIG. 5. FIGS. 17, 20, 23, and 26 are cross-sectional views taken along the line III-III' of FIG. 5.

Figure 15:
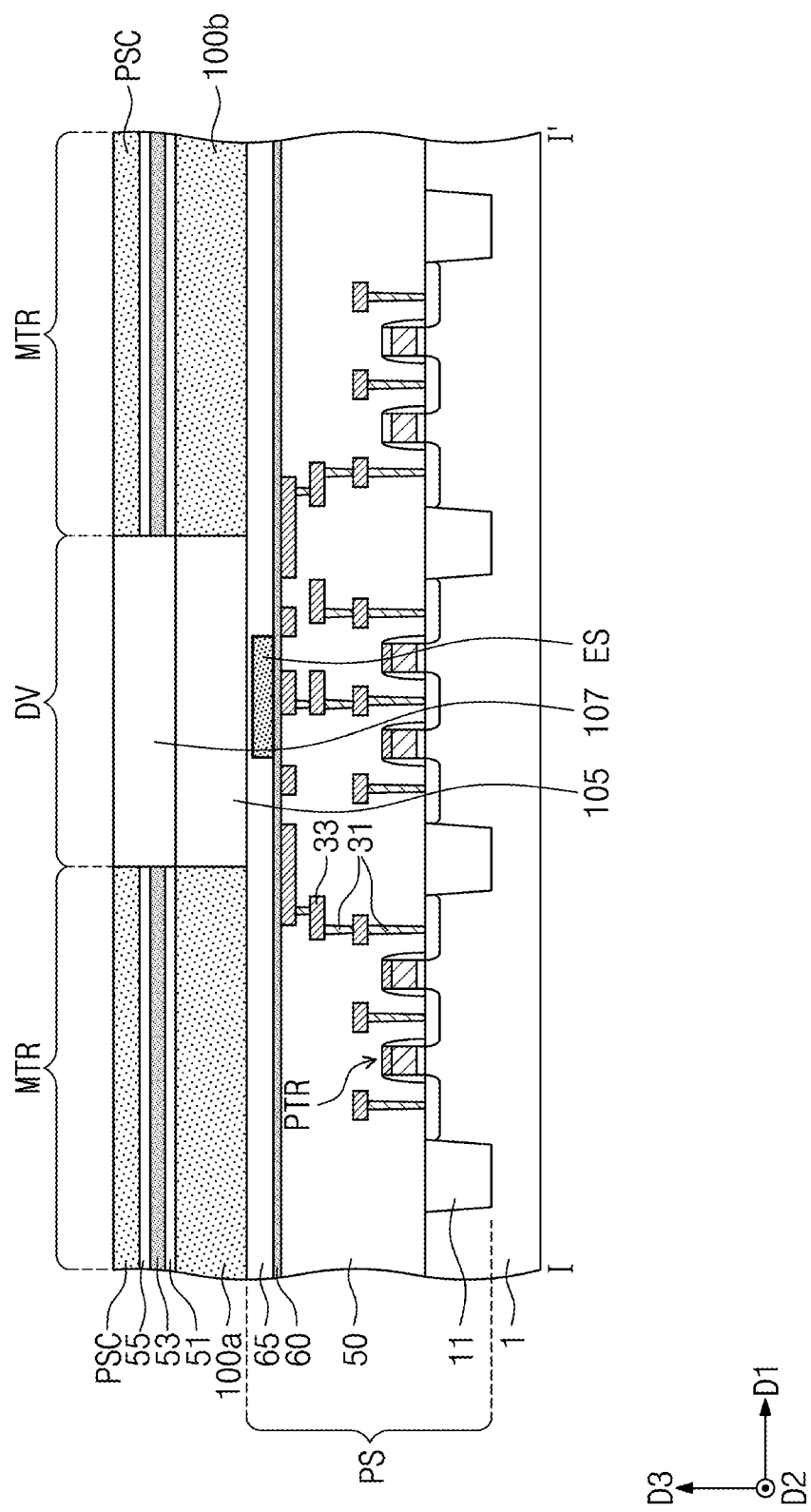
FIGS. 15, 18, 21, and 24 are cross-sectional views illustrating a method of fabricating a three-dimensional semiconductor memory device, taken along the line I-I' of FIG. 5, according to exemplary embodiments of the present inventive concepts.
Figure 16:
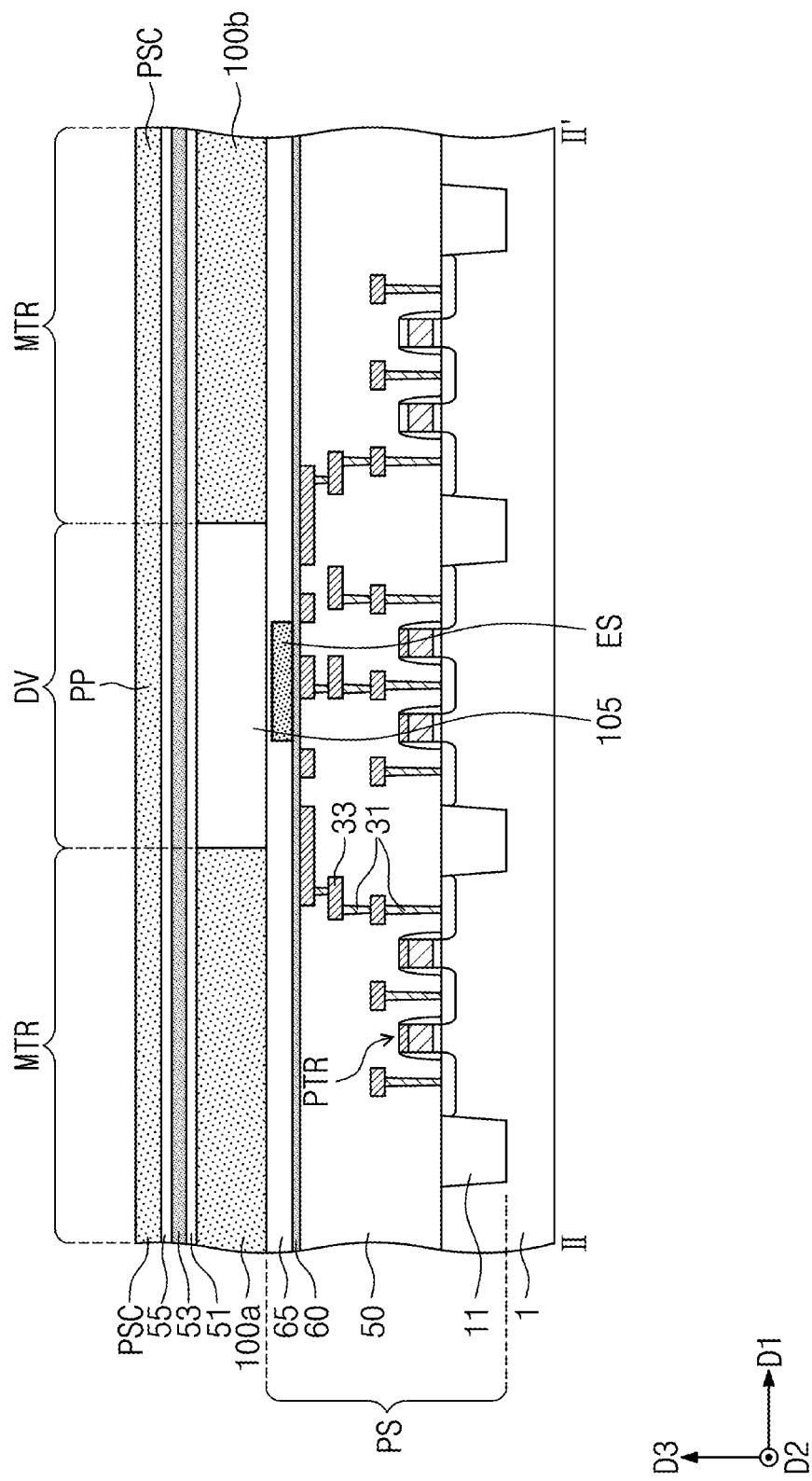
FIGS. 16, 19, 22, and 25 are cross-sectional views illustrating a method of fabricating a three-dimensional semiconductor memory device, taken along the line II-II' of FIG. 5, according to exemplary embodiments of the present inventive concepts.
Figure 17:
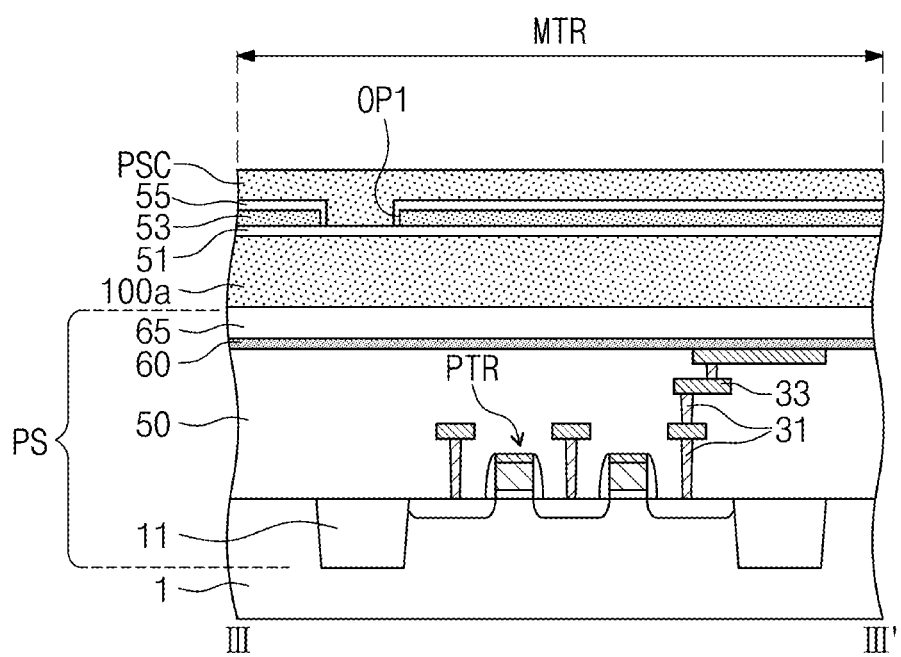
FIGS. 17, 20, 23, and 26 are cross-sectional views illustrating a method of fabricating a three-dimensional semiconductor memory device, taken along the line III-III' of FIG. 5, according to exemplary embodiments of the present inventive concepts.
Figure 17:
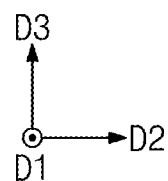

Referring to FIGS. 15 to 17, the peripheral circuit structure PS may be formed on the semiconductor substrate 1. The semiconductor substrate 1 may include chip regions and a scribe line region, as previously described with reference to FIG. 1. The semiconductor substrate 1 may be a silicon wafer. The formation of the peripheral circuit structure PS may include forming the peripheral logic circuits PTR on the semiconductor substrate 1, forming the peripheral interconnection structures, such as the peripheral contact plugs 31 and the peripheral circuit lines 33 connected to the peripheral logic circuits PTR, and forming the lower interlayered insulating layer 50. In an exemplary embodiment, a first wafer including the peripheral circuit structure PS may be separately prepared, and the cell array structure CS to be described below may be formed on a second wafer. A bonding process may then be performed to bond the first and second wafers to each other to form the semiconductor device.

The row and column decoders, the page buffers, and the control circuits, which serve as the peripheral logic circuits PTR, may be formed on each chip region of the semiconductor substrate 1. In an exemplary embodiment, the formation of the peripheral logic circuits PTR may include forming the device isolation layer 11 in the semiconductor substrate 1 to define active regions and then forming peripheral gate electrodes on the semiconductor substrate 1.

The formation of the peripheral interconnection structures may include forming the peripheral contact plugs 31 to penetrate portions of the lower interlayered insulating layer 50 and forming the peripheral circuit lines 33 connected to the peripheral contact plugs 31. After the formation of the peripheral logic circuits PTR and peripheral interconnection structure 31 and 33, the lower interlayered insulating layer 50 may be formed to cover the entire top surface of the semiconductor substrate 1 (e.g., in the third direction D3). The lower interlayered insulating layer 50 may include a single insulating layer or a plurality of stacked insulating layers. In an exemplary embodiment, the lower interlayered insulating layer 50 may include at least one of a silicon oxide layer, a silicon nitride layer, a silicon oxynitride layer, and a low-k dielectric layer.

The etch stop layer 60 and the intermediate interlayered insulating layer 65 may be sequentially formed on the lower interlayered insulating layer 50. For example, the etch stop layer 60 may be formed directly on the lower interlayered insulating layer (e.g., in the third direction D3). The intermediate interlayered insulating layer 65 may be formed directly on the etch stop layer 60 (e.g., in the third direction D3). In an exemplary embodiment, the etch stop layer 60 may be formed of or include an insulating material having an etch selectivity with respect to the lower interlayered insulating layer 50. For example, the etch stop layer 60 may include a silicon nitride layer or a silicon oxynitride layer. In an exemplary embodiment, the intermediate interlayered insulating layer 65 may be formed of or include the same material as the lower interlayered insulating layer 50.

The etch stop pattern ES may be formed on the etch stop layer 60. For example, the etch stop pattern ES may be formed by forming a poly silicon layer directly on a top surface of the etch stop layer 60 and patterning the poly silicon layer. Thereafter, the intermediate interlayered insulating layer 65 may be formed on the etch stop layer 60 provided with the etch stop pattern ES. In an alternative embodiment, the etch stop layer 60 may be concurrently formed with the horizontal patterns, which will be described below, and then may be patterned to form patterns separated from each other.

After the formation of the peripheral circuit structure PS, the horizontal patterns 100a and 100b may be formed to cover the peripheral circuit structure PS (e.g., in the third direction D3). In an exemplary embodiment, the horizontal patterns 100a and 100b may be formed by forming a semiconductor layer on the intermediate interlayered insulating layer 65 and patterning the semiconductor layer. In an exemplary embodiment, the horizontal patterns 100a and 100b may be formed by depositing a poly-silicon layer to cover the entire top surface of the semiconductor substrate 1 (e.g., in the third direction D3). In an exemplary embodiment, the poly-silicon layer may be doped with the first conductivity type impurities, during the deposition of the poly-silicon layer.

In an exemplary embodiment, the horizontal patterns 100a and 100b may be formed to be spaced apart from each other in the first and second directions D1 and/or D2, as shown in FIG. 4A. The first insulating penetration layer 105 may be formed to fill a region between the horizontal patterns 100a and 100b. In an exemplary embodiment, the first insulating penetration layer 105 may be formed of or include silicon oxide. Thereafter, a planarization process may be performed to expose the top surfaces of the horizontal patterns 100a and 100b. In an exemplary embodiment, the horizontal patterns 100a and 100b may formed the mat regions MTR, and the first insulating penetration layer 105 may form the division region DV between the mat regions MTR (e.g., in the first direction D1 and/or second direction D2).

A first sacrificial pattern 51 and a second sacrificial pattern 53 may be sequentially formed on the horizontal patterns 100a and 100b, and an opening OP1 may be formed to penetrate the second sacrificial pattern 53. As shown in the exemplary embodiment of FIG. 17, the opening OP1 may expose the first sacrificial pattern 51 (e.g., a top surface of the first sacrificial pattern). Thereafter, a third sacrificial pattern 55 may be formed to fill the opening OP1 and to cover the second sacrificial pattern 53. In an exemplary embodiment, the first sacrificial pattern 51 and the third sacrificial pattern 55 may be formed of or include silicon oxide. The second sacrificial pattern 53 may be formed of or include, for example, silicon nitride or poly silicon.

A preliminary conductive source pattern PSC may be formed on the third sacrificial pattern 55. The preliminary conductive source pattern PSC may be formed to cover the horizontal patterns 100a and 100b, in the mat regions MTR. The preliminary conductive source pattern PSC may be extended to the division region DV to form protruding patterns PP. In an exemplary embodiment, the preliminary conductive source patterns PSC in adjacent mat regions MTR may be connected to each other through the protruding patterns PP, which are extended to the division region DV. The first to third sacrificial patterns 51, 53, and 55 may also be patterned by a patterning process for forming the preliminary conductive source pattern PSC, and thus, the first to third sacrificial patterns 51, 53, and 55 may have substantially the same planar shape as the preliminary conductive source pattern PSC.

In an exemplary embodiment, the preliminary conductive source pattern PSC may cover the top surface of the edge of the semiconductor substrate 1 at the edge of the wafer. In other words, the preliminary conductive source pattern PSC may be in direct contact with the semiconductor substrate 1 at the edge of the wafer.

The second insulating penetration layer 107 may be formed on the first insulating penetration layer 105 to fill a region, in which the preliminary conductive source pattern PSC and the first to third sacrificial patterns 51, 53, and 55 are not formed. The second insulating penetration layer 107 may be formed of or include, for example, silicon oxide.

Figure 18:
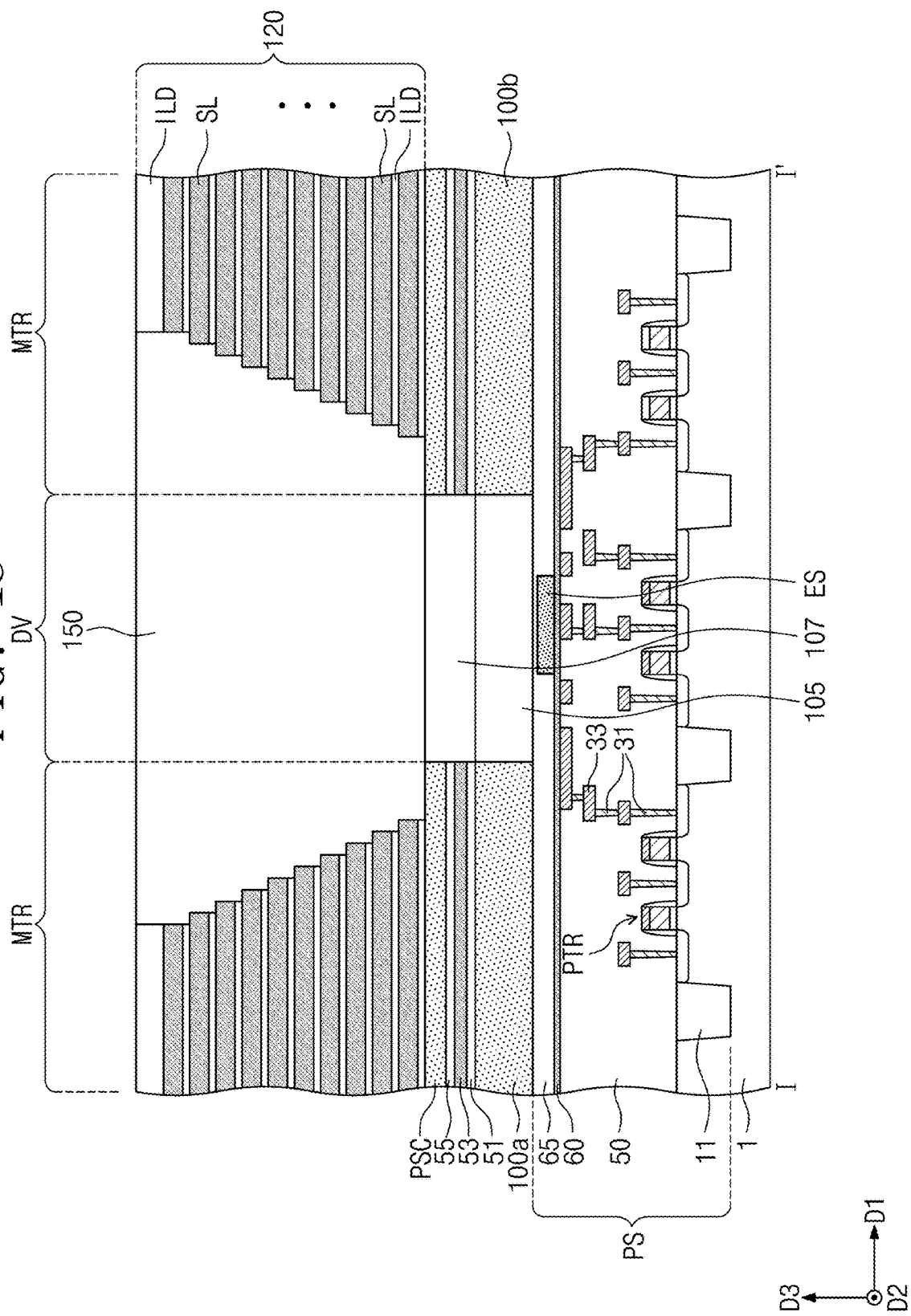
Figure 19:
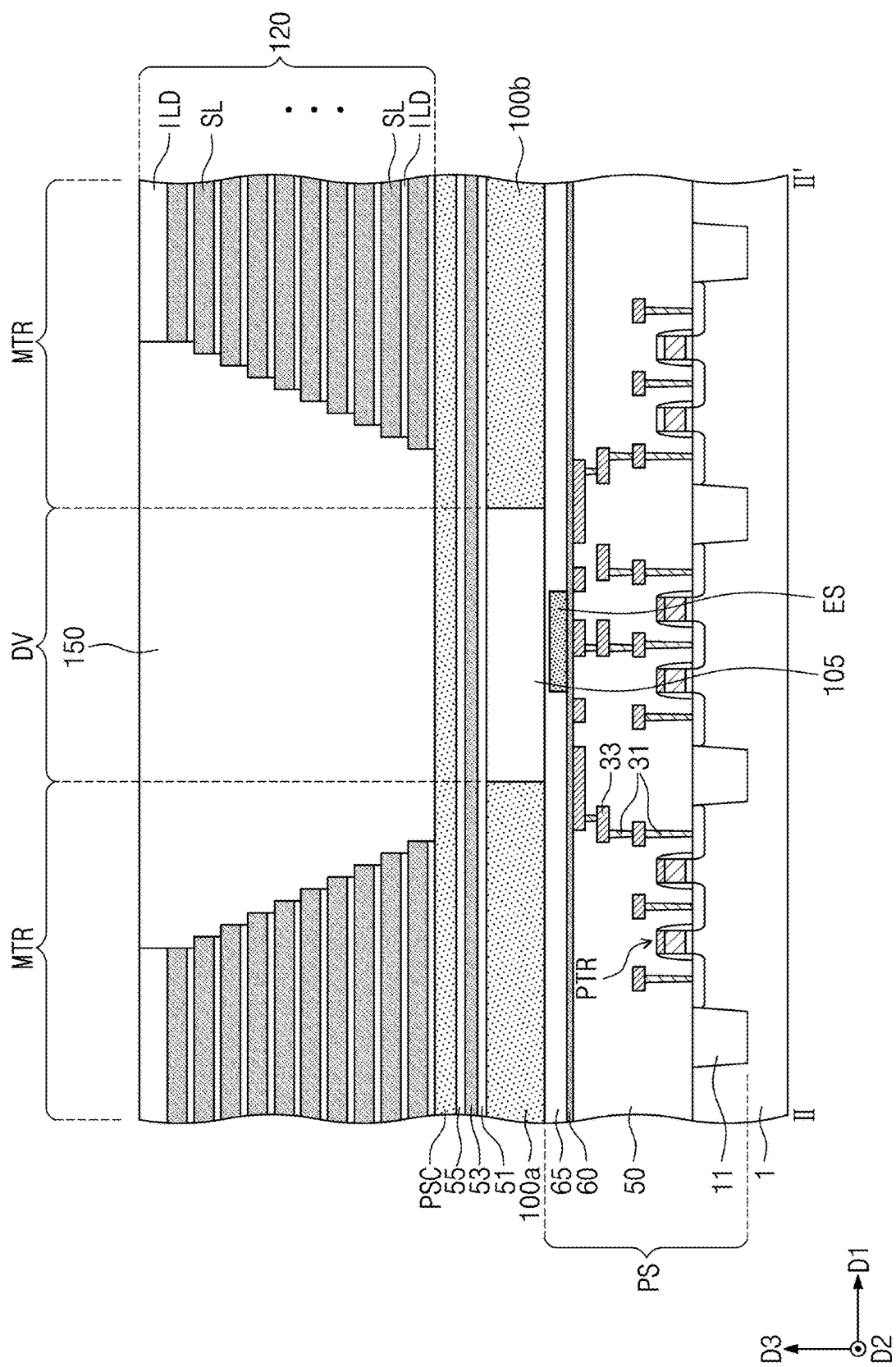
Figure 20:
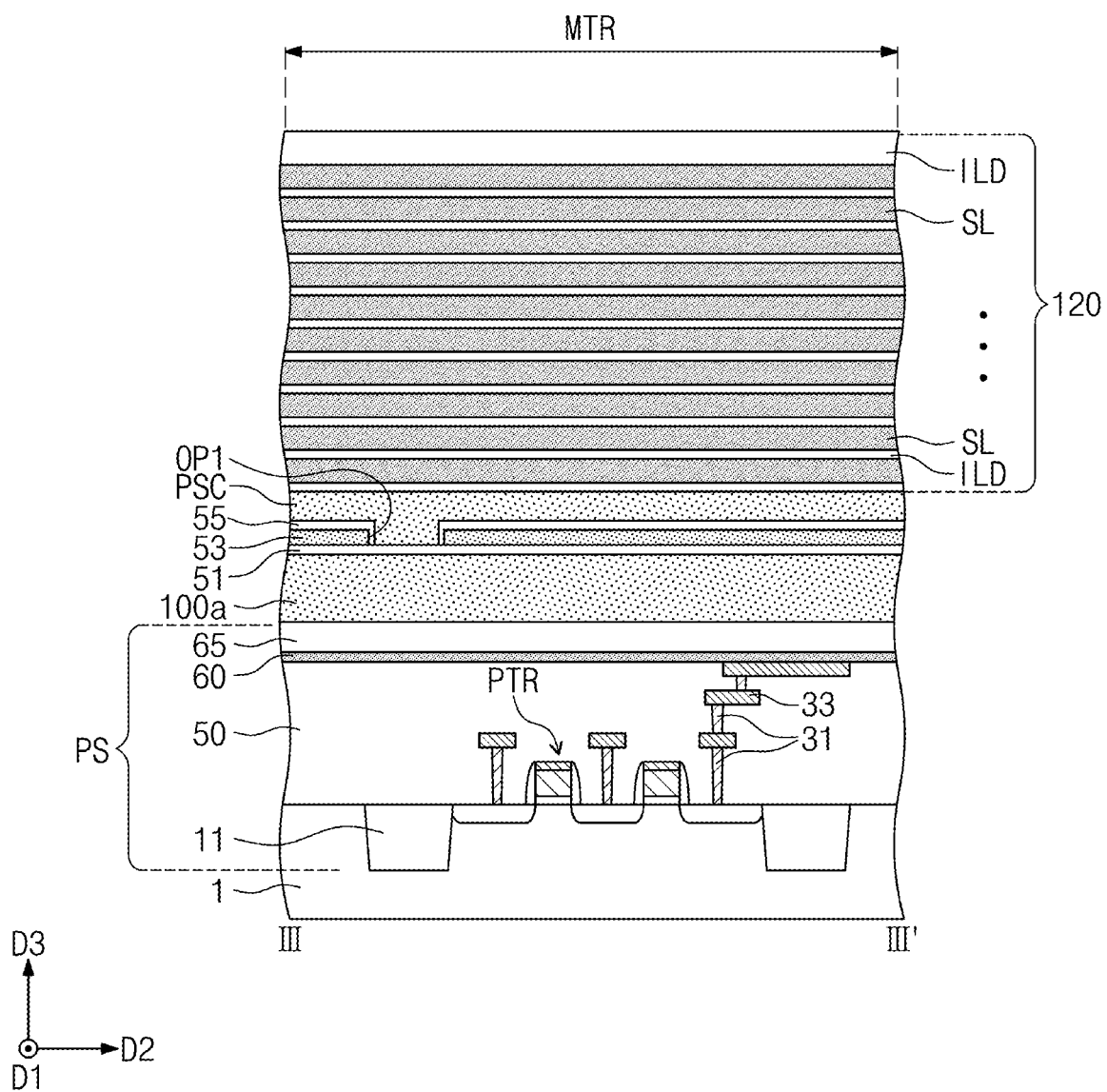

Referring to FIGS. 18 to 20, mold structures 120 may be formed on the preliminary conductive source pattern PSC. The mold structures 120 may be formed on the horizontal patterns 100a and 100b, respectively. Each of the mold structures 120 may include sacrificial layers SL and the insulating layers ILD, which are alternately and repeatedly stacked (e.g., in the third direction D3). In an exemplary embodiment, the sacrificial layers SL and the insulating layers ILD may be formed using a thermal chemical vapor deposition (Thermal CVD) process, a plasma-enhanced chemical vapor deposition (PE-CVD) process, or an atomic layer deposition (ALD) process. The sacrificial layers SL may be formed of a material, which can be etched with an etch selectivity with respect to the insulating layers ILD. For example, the sacrificial layers SL may be formed of a material that can be selectively etched without an excessive etching of the insulating layers ILD. In an exemplary embodiment, the sacrificial layers SL and the insulating layers ILD may have a high etch selectivity in a wet etching process using a chemical solution and may have a low etch selectivity in a dry etching process using an etching gas. In an exemplary embodiment, the sacrificial layers SL and the insulating layers ILD may be formed of different insulating materials that have the etch selectivity with respect to each other. For example, the sacrificial layers SL may be formed of a silicon nitride layer, and the insulating layers ILD may be formed of a silicon oxide layer.

The formation of the mold structures 120 may include performing a trimming process. In an exemplary embodiment, the trimming process may include steps of forming a mask pattern on a layered structure, etching a portion of the layered structure, reducing a horizontal area of the mask pattern, and removing the mask pattern. The steps of etching a portion of the layered structure and reducing the horizontal area of the mask pattern may be repeated several times, before the step of removing the mask pattern. As a result of the trimming process, each of the mold structures 120 may have a staircase structure in the edge portion of each of the mat regions MTR.

The upper interlayered insulating layer 150 may be formed to fill a region between the mold structures 120. The formation of the upper interlayered insulating layer 150 may include thickly depositing an insulating layer to cover the mold structures 120 and performing a planarization process on the insulating layer. The upper interlayered insulating layer 150 may be formed of an insulating material, which has an etch selectivity with respect to the sacrificial layers SL.

Figure 21:
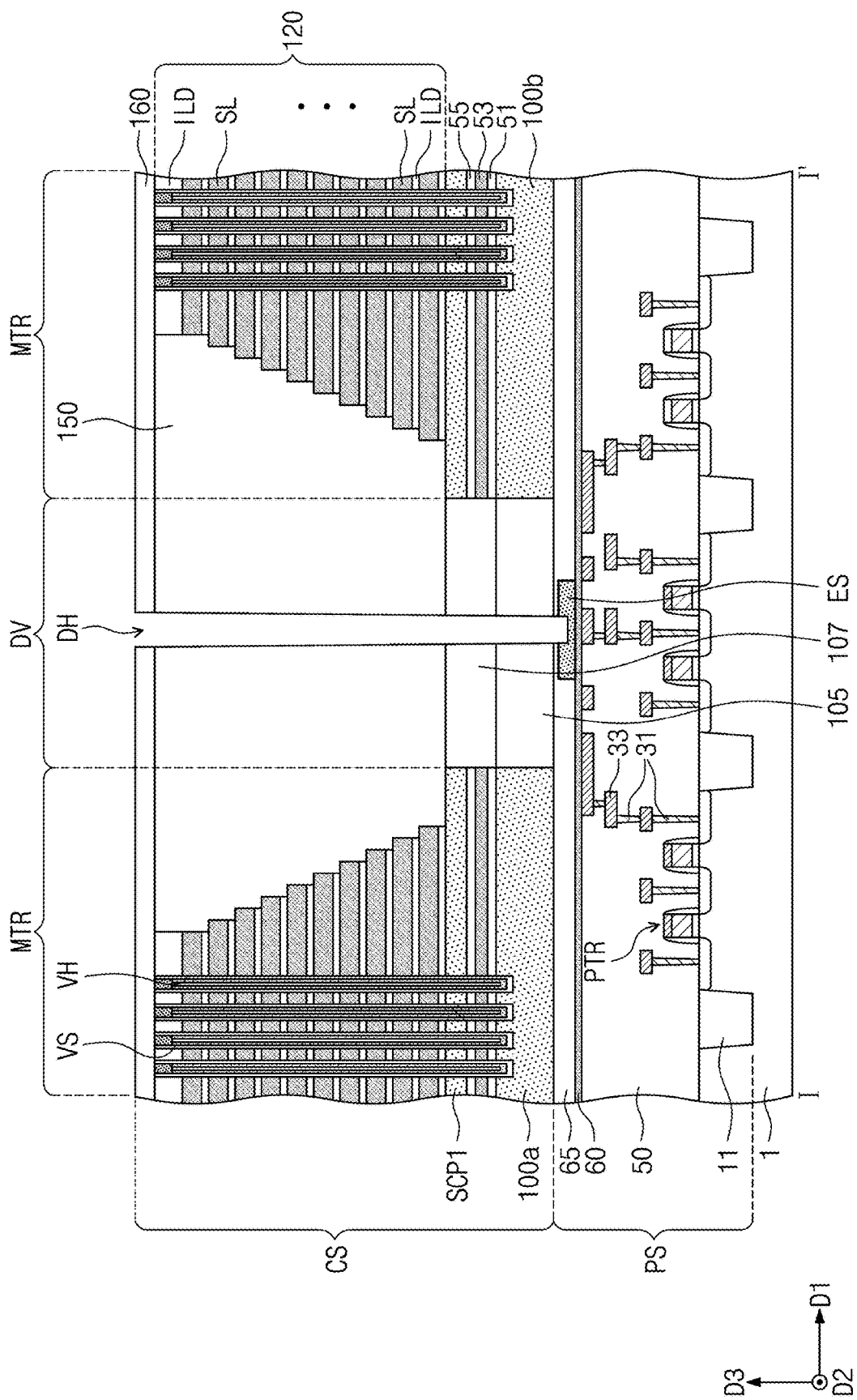
Figure 22:
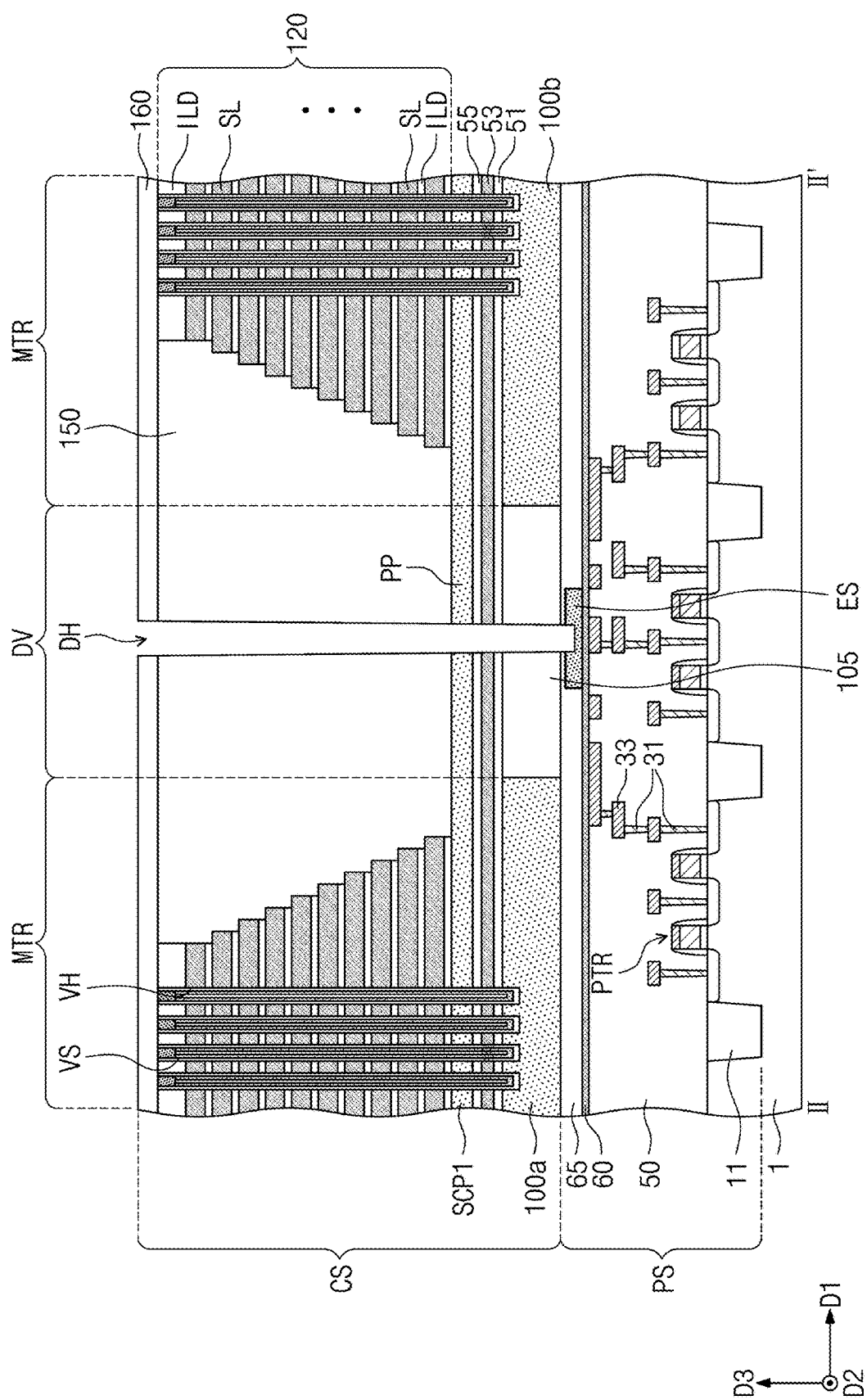
Figure 23:
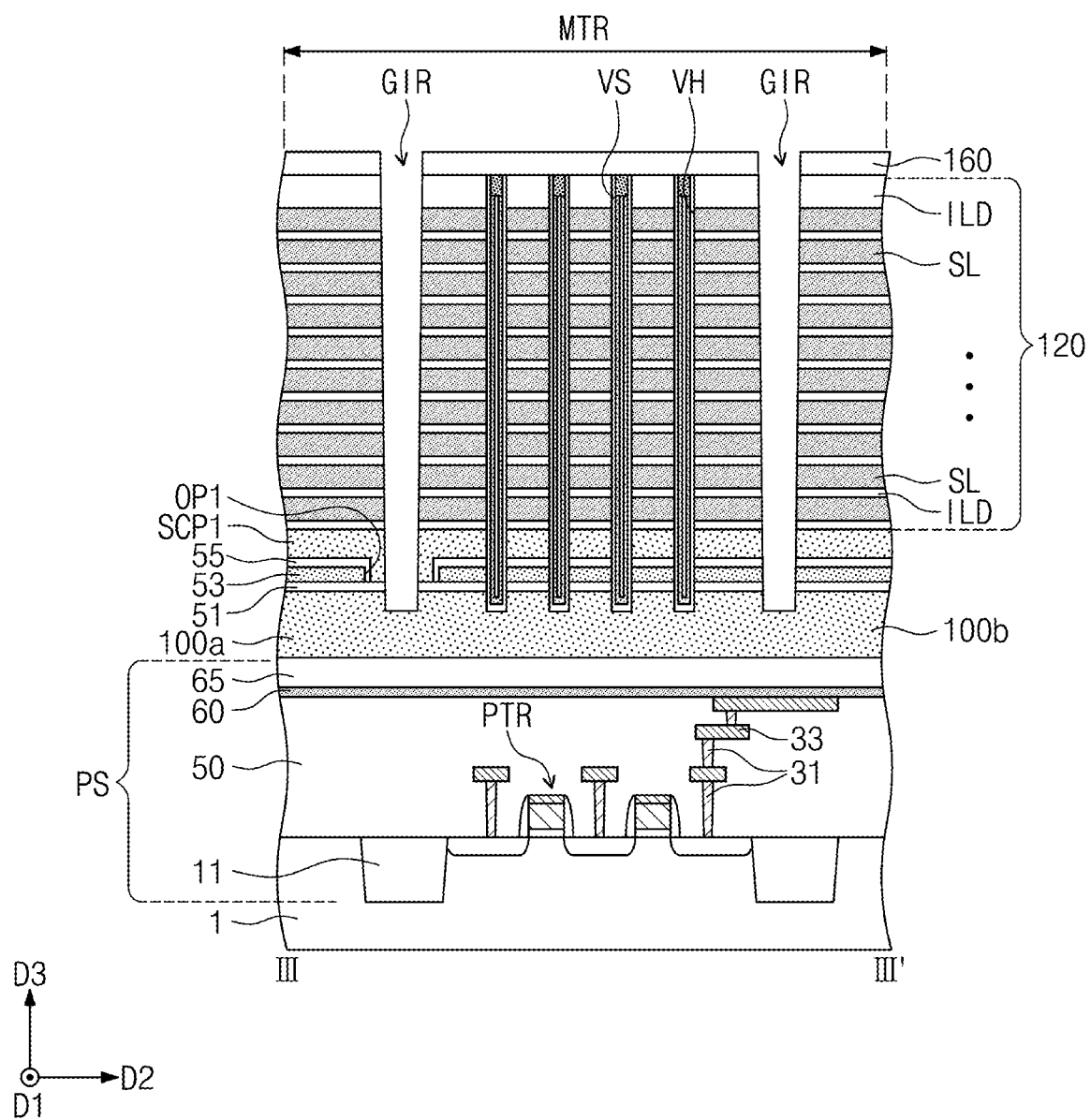

Referring to FIGS. 21 to 23, a plurality of the vertical structures VS may be formed to penetrate the mold structures 120. The formation of the vertical structures VS may include vertical holes VH penetrating the mold structures 120 (e.g., in the third direction D3). For example, the formation of the vertical holes VH may include forming a hard mask pattern to cover the mold structures 120 and anisotropically etching the mold structures 120 using the hard mask pattern as an etch mask. In an exemplary embodiment, the anisotropic etching process on the mold structures 120 may be a plasma etching process, a reactive ion etching (RIE) process, an inductively-coupled plasma reactive ion etching (ICP-RIE) process, or an ion beam etching (IBE) process.

According to an exemplary embodiment of the present inventive concepts, in an embodiment in which the anisotropic etching process is performed using the high-power plasma, positive charges, which are induced from ions and/or radicals in the plasma, may be charged on the surfaces of the horizontal patterns 100a and 100b exposed by the vertical holes VH. In addition, according to an exemplary embodiment of the present inventive concepts, during fabricating the three-dimensional semiconductor device, the semiconductor substrate 1 may be placed on a supporter of a semiconductor fabrication apparatus, and a ground voltage from the supporter may be applied to the semiconductor substrate 1, during the anisotropic etching for forming the vertical holes VH.

During the anisotropic etching process using the plasma, the horizontal patterns 100a and 100b may be connected to each other by the preliminary conductive source pattern PSC including the protruding patterns PP and may be in direct contact with the top surface of the edge of the semiconductor substrate 1 at the edge of the wafer. Therefore, the positive charges, which are charged on the surfaces of the horizontal patterns 100a and 100b during the formation of the vertical holes VH, may be discharged to the outside through the semiconductor substrate 1.

Since, as described above, the ground voltage can be applied to the preliminary conductive source pattern PSC during the formation of the vertical holes VH, it may be possible to prevent the positive charges on the horizontal patterns 100a and 100b from causing an arcing issue.

The vertical structures VS may then be formed in the vertical holes VH. The vertical structures VS may be formed of or include at least one of semiconductor materials or conductive materials, as described above. In an exemplary embodiment, prior to the formation of the vertical structures VS, the data storage patterns DSP described with reference to FIG. 9 may be formed in the vertical holes VH.

The first interlayered insulating layer 160 may be formed to cover the vertical structures VS, and division trenches DH may be formed in the division region DV. The division trenches DH may be formed to penetrate the first interlayered insulating layer 160 and the upper interlayered insulating layer 150 and to divide the preliminary conductive source pattern PSC into the first conductive source patterns SCP1, which are separated from each other in the division region DV. Furthermore, the division trenches DH may be formed to expose the top surface of the etch stop pattern ES. In an exemplary embodiment, the division trenches DH may not penetrate the etch stop pattern ES, and the etch stop pattern ES may prevent damage of an interconnection line, which may occur when the peripheral circuit lines 33 are exposed by the division trenches DH. Therefore, the etch stop pattern ES may prevent a metal contamination issue which is caused by a damaged interconnection line.

Thereafter, gate division regions GIR may be formed to be extended from the mat regions MTR in the first direction D1 and to vertically penetrate the mold structures 120 (e.g., in the third direction D3). In an exemplary embodiment, the gate division regions GIR may be formed by the same etching process as the etching process for the division trenches DH. However, exemplary embodiments of the present inventive concepts are not limited thereto. The gate division regions GIR may penetrate the first conductive source patterns SCP1 and may expose the horizontal patterns 100a and 100b. At least a portion of the gate division regions GIR may expose the first to third sacrificial patterns 51, 53, and 55.

Figure 24:
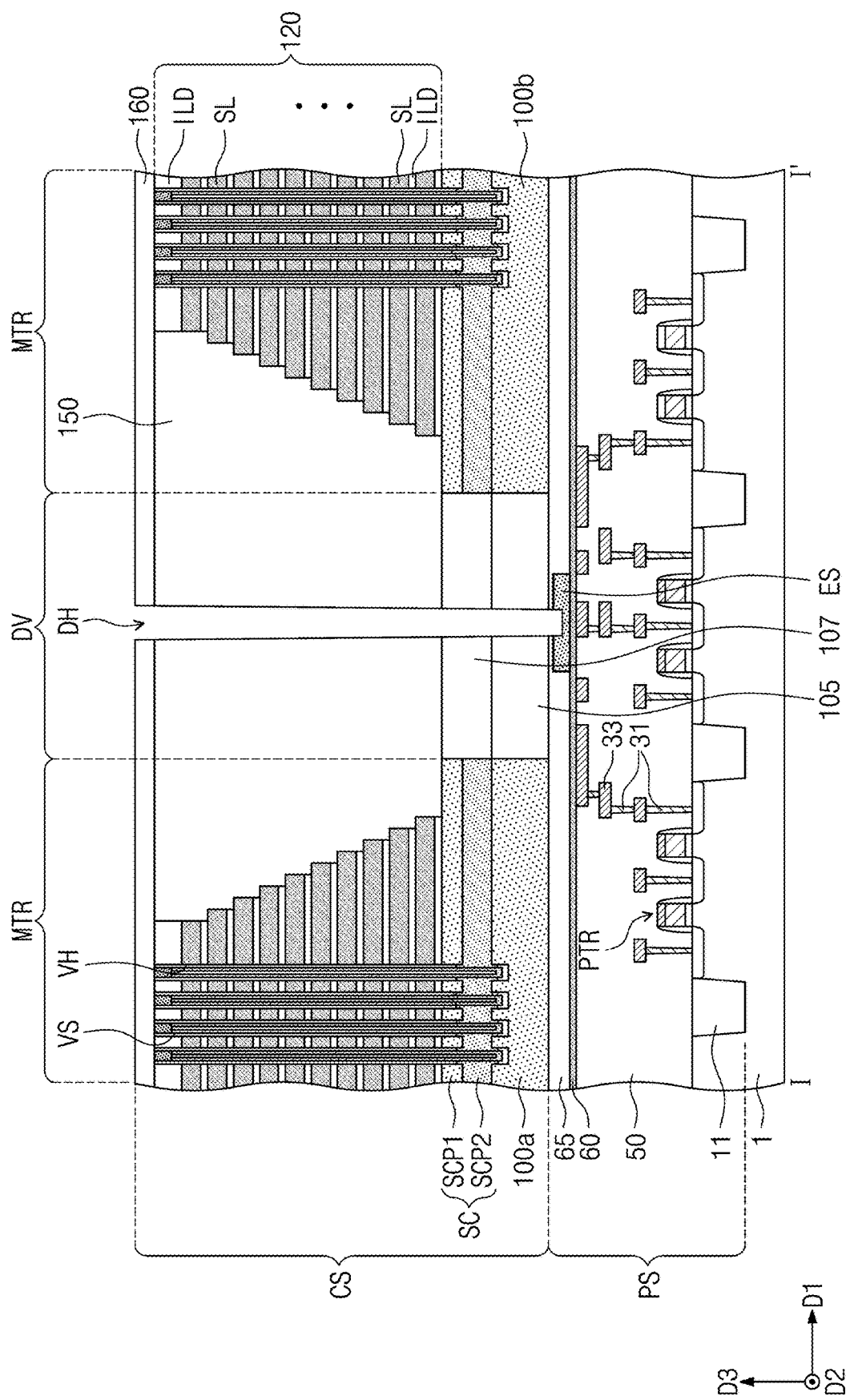
Figure 25:
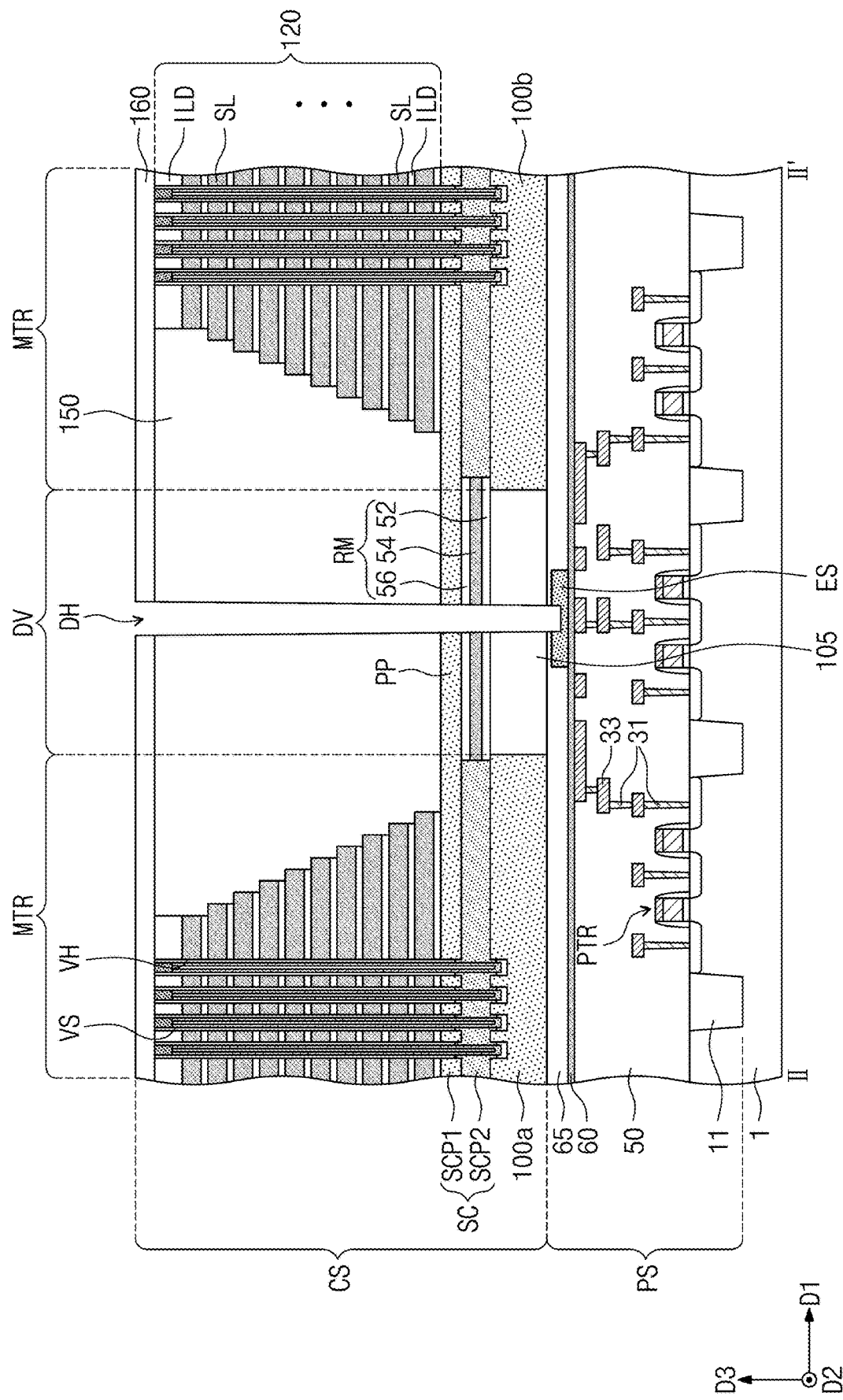
Figure 26:
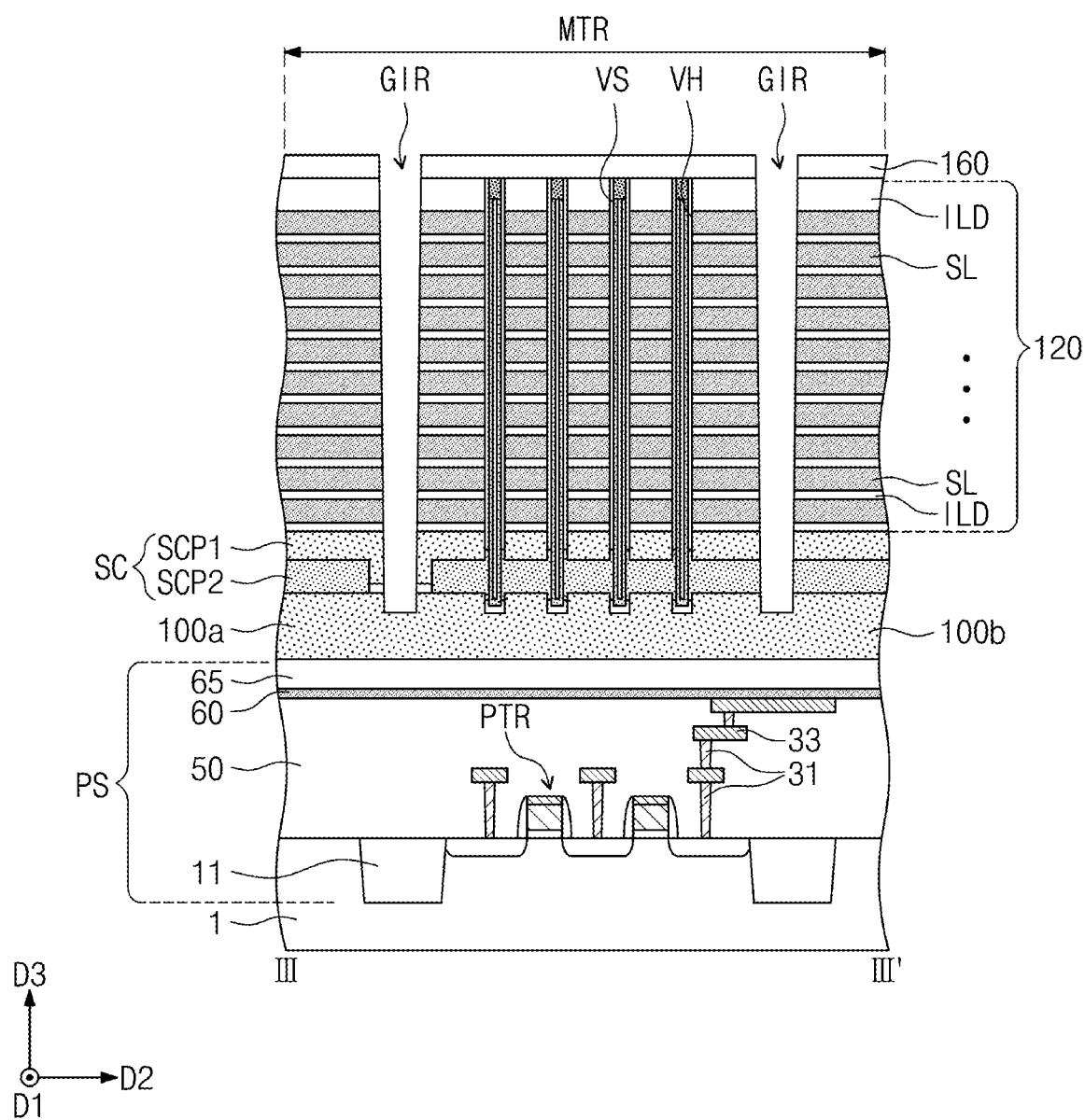

Referring to FIGS. 24 to 26, the first to third sacrificial patterns 51, 53, and 55 may be replaced with the second conductive source patterns SCP2. For example, the first to third sacrificial patterns 51, 53, and 55 may be removed, and the second conductive source patterns SCP2 may be formed in the regions that the first to third sacrificial patterns 51, 53, and 55 were removed. The first to third sacrificial patterns 51, 53, and 55 may be selectively removed. For example, in an exemplary embodiment, the second sacrificial pattern 53 exposed by the division region DV may be selectively removed, and subsequently the first and third sacrificial patterns 51 and 55 may together be selectively removed. Portions of the first to third sacrificial patterns 51, 53, and 55, which are located in a region relatively far from the gate division regions GIR, may be left in the division region DV. In other words, a remaining mold pattern RM including the first to third remaining sacrificial patterns 51, 53, and 55 may be formed in the division region DV. During the removal of the first to third sacrificial patterns 51, 53, and 55, the sidewalls of the sacrificial layers SL and the insulating layers ILD may be covered with a protection layer.

Referring back to FIGS. 5 to 9, a replacement process may be performed to replace the sacrificial layers SL of the mold structures 120 with the electrodes EL. Accordingly, the electrode structures ST including the electrodes EL vertically stacked on the horizontal patterns 100a and 100b may be formed. For example, the sacrificial layers SL exposed by the division trenches DH may be removed to form gate regions between the insulating layers ILD. In an embodiment in which the sacrificial layers SL are silicon nitride layers and the insulating layers ILD are silicon oxide layers, the removal of the sacrificial layers SL may be performed through an isotropic etching process, in which an etching solution including phosphoric acid is used.

The electrodes EL may then be formed in the gate regions. Each of the electrodes EL may include a barrier metal layer and a metal layer, which are sequentially deposited. The electrode structure ST may have the staircase structure at the edge of each mat region MTR.

The first insulating spacer SS1 and the common source electrode CSP may be formed in the gate division regions GIR, respectively. The common source electrode CSP may be connected to the horizontal patterns 100a and 100b. In an exemplary embodiment, the common source electrode CSP may be formed of or include at least one compound selected from doped poly silicon, metals, or conductive metal nitrides. The second interlayered insulating layer 165 may be formed to cover the common source electrode CSP.

The penetration plugs TPLG may be formed to vertically penetrate (e.g., in the third direction D3) the first and second interlayered insulating layers 160 and 165, the upper interlayered insulating layer 150, the first and second insulating penetration layers 105 and 107, the intermediate interlayered insulating layer 65, and the etch stop layer 60 and to be connected to the peripheral circuit lines 33. In an exemplary embodiment, the second insulating spacer SS2 may be formed to cover side surfaces of penetration holes and penetration plugs TPLG may subsequently be formed.

The cell contact plugs PLG may be formed to vertically penetrate (e.g., in the third direction D3) the first and second interlayered insulating layers 160 and 165 and the upper interlayered insulating layer 150 and to be coupled to end portions of the electrodes EL, respectively. In addition, the bit line contact plug BPLG may be formed to be electrically connected to the vertical structure VS.

The bit lines BL and the connection lines CL described above may be formed on the second interlayered insulating layer 165. Thereafter, the semiconductor substrate 1 may be cut along the scribe line region 20 (e.g., see FIG. 1) by a cutting or sawing machine, and thus, the three-dimensional semiconductor devices formed on the semiconductor substrate 1 may be separated from a plurality of semiconductor chips.

Figure 27:
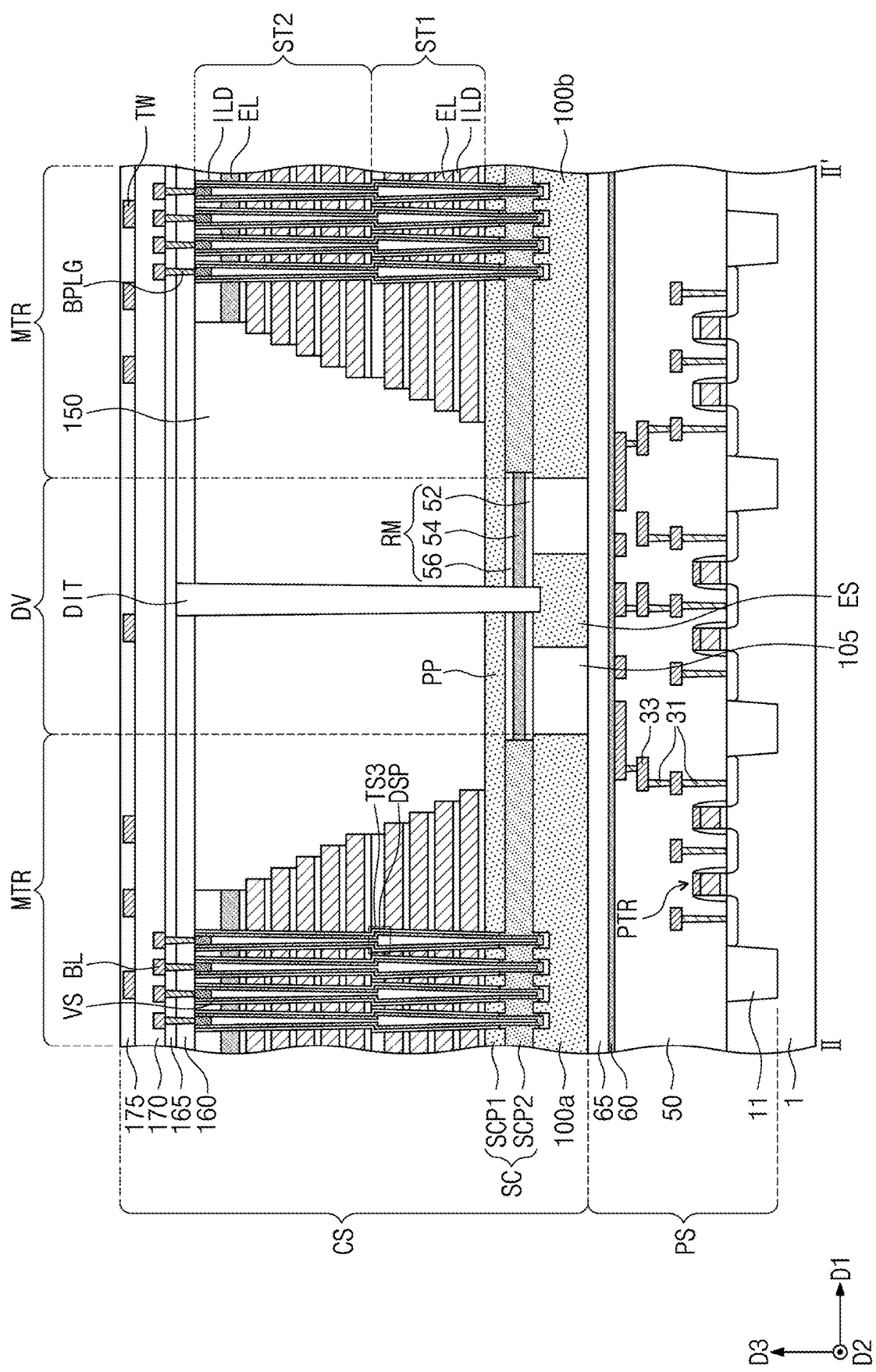
FIG. 27 is a cross-sectional view of a three-dimensional semiconductor memory device taken along the line II-II' of FIG. 5 according to an exemplary embodiment of the present inventive concepts.

FIG. 27 is a cross-sectional view, which is taken along the line II-II' of FIG. 5 to illustrate a three-dimensional semiconductor memory device according to an exemplary embodiment of the present inventive concepts.

As shown in the exemplary embodiment of FIG. 27, the electrode structure may include a first electrode structure ST1 and a second electrode structure ST2 on the first electrode structure ST1 (e.g., in the third direction D3). A distance between the uppermost electrode EL of the first electrode structure ST1 and the lowermost electrode EL of the second electrode structure ST2 (e.g., a distance in the third direction D3) may be greater than the corresponding distance between the uppermost and lowermost electrodes EL of the first electrode structure ST1.

The data storage patterns DSP and the vertical structures VS, which are provided to penetrate the first and second electrode structures ST1 and ST2, may have a staircase structure TS3 near an interface between the first and second electrode structures ST1 and ST2. For example, the data storage patterns DSP and the vertical structures VS may be provided in channel holes penetrating each of the first and second electrode structures ST1 and ST2. In an exemplary embodiment, separate patterning processes may be performed on the first and second electrode structures ST1 and ST2, respectively to form the channel holes in each of the first and second electrode structures ST1 and ST2. The staircase structure TS3 may be a result of the patterning processes, which are separately performed on the first and second electrode structures ST1 and ST2.

According to an exemplary embodiment of the present inventive concepts, horizontal patterns including a plurality of mat regions may be grounded through source structures, during a process using high frequency power. Accordingly, when a process using the high frequency power is performed to fabricate three-dimensional semiconductor memory devices, it may be possible to prevent an arcing issue by positive charges, which are charged in the horizontal patterns.

According to an exemplary embodiment of the present inventive concepts, it may be possible to prevent damage of an interconnection line, which may occur when peripheral circuit lines are exposed during separation of the horizontal patterns, and to prevent a metal contamination issue, which is caused by a damaged interconnection line.

While exemplary embodiments of the present inventive concepts have been particularly shown and described, it will be understood by one of ordinary skill in the art that variations in form and detail may be made therein without departing from the spirit and scope of the attached claims.

What is claimed is:

1. A semiconductor memory device, comprising:
    horizontal patterns disposed on a peripheral circuit structure and spaced apart from each other in a first direction;
    memory structures disposed on the horizontal patterns, the memory structures comprising source structures and electrode structures;
    a division structure disposed between adjacent horizontal patterns in the first direction, the division structure configured to separate the source structures of adjacent memory structures from each other; and
    an etch stop pattern disposed between the horizontal patterns and disposed at a level lower than a level of the source structures, the etch stop pattern connected to a lower portion of the division structure,
    wherein the etch stop pattern comprises a first sub-pattern extending in the first direction and a second sub-pattern extending in a second direction crossing the first direction.

2. The semiconductor memory device of claim 1, wherein:
    each of the horizontal patterns comprises a first edge parallel to the first direction and a second edge parallel to the second direction;
    the first sub-pattern is extended along the first edge; and
    the second sub-pattern is extended along the second edge.

3. The semiconductor memory device of claim 1, wherein:
    the first sub-pattern comprises a plurality of first sub-patterns;
    the second sub-pattern comprises a plurality of second sub-patterns; and
    the etch stop pattern has a grid shape formed by the plurality of first sub-patterns and the plurality of second sub-patterns crossing each other.

4. A semiconductor memory device, comprising:
    horizontal patterns disposed on a peripheral circuit structure and spaced apart from each other in a first direction;
    memory structures disposed on the horizontal patterns, the memory structures comprising source structures and electrode structures;
    a division structure disposed between adjacent horizontal patterns in the first direction, the division structure configured to separate the source structures of adjacent memory structures from each other; and
    an etch stop pattern disposed between the horizontal patterns and disposed at a level lower than a level of the source structures, the etch stop pattern connected to a lower portion of the division structure,
    wherein the etch stop pattern is formed of a non-metallic material having an etch selectivity with respect to a silicon oxide layer and a silicon nitride layer.

5. The semiconductor memory device of claim 1, wherein a width of the etch stop pattern in the first direction is greater than a width of the division structure in the first direction.

6. The semiconductor memory device of claim 1, wherein a width of the etch stop pattern in the second direction greater than a width of the division structure in the second direction.

7. The semiconductor memory device of claim 1, wherein the division structure has a bar or rectangular shape.

8. The semiconductor memory device of claim 1, wherein a top surface of the etch stop pattern is positioned at a level lower than bottom surfaces of the horizontal patterns.

9. The semiconductor memory device of claim 1, wherein:
    a top surface of the etch stop pattern is positioned at a same level as top surfaces of the horizontal patterns; and
    a bottom surface of the etch stop pattern is positioned at a same level as bottom surfaces of the horizontal patterns.

10. The semiconductor memory device of claim 1, further comprising:
    remaining mold patterns disposed between adjacent horizontal patterns in the first direction and between the source structures and the etch stop pattern in a direction of a thickness of the semiconductor memory device,
    wherein the division structure is configured to separate the remaining mold patterns in the first direction.

11. The semiconductor memory device of claim 10, wherein:
    the source structures comprise first conductive source patterns disposed on the horizontal patterns and second conductive source patterns disposed between the first conductive source patterns and the horizontal patterns, and
    the second conductive source patterns are positioned at a same level as a level of the remaining mold patterns.

12. The semiconductor memory device of claim 11, wherein top surfaces of the remaining mold patterns are in contact with bottom surfaces of the first conductive source patterns.

13. The semiconductor memory device of claim 11, wherein:
    sidewalls of the second conductive source patterns are disposed on the horizontal patterns; and
    sidewalls of the first conductive source patterns are in contact with sidewalls of the division structure.

14. The semiconductor memory device of claim 1, further comprising:
    penetration plugs connecting the memory structures to the peripheral circuit structure,
    wherein the penetration plugs are spaced apart from the etch stop pattern and the division structure in the first direction.

15. The semiconductor memory device of claim 14, wherein a bottom surface of the division structure is positioned at a level higher than bottom surfaces of the penetration plugs.

16. The semiconductor memory device of claim 1, wherein a thickness of the etch stop pattern is in a range of about 800 Å to about 2000 Å.

17. The semiconductor memory device of claim 4, wherein the etch stop pattern comprises poly silicon.

18. A semiconductor memory device, comprising:
    horizontal patterns disposed on a peripheral circuit structure and spaced apart from each other with a division region interposed therebetween in a first direction, the division region including a first insulating penetration layer;
    memory structures disposed on the horizontal patterns, the memory structures comprising source structures and electrode structures on the source structures;
    vertical structures penetrating the electrode structures and connected to the source structures;

a division structure disposed in the division region, the division structure configured to separate the source structures of adjacent memory structures from each other;

an etch stop pattern disposed between the horizontal patterns and disposed at a level lower than a level of the horizontal patterns, the etch stop pattern connected to a lower portion of the division structure; and penetration plugs configured to connect the memory structures to the peripheral circuit structure, wherein the source structures comprise first conductive source patterns disposed on the horizontal patterns and second conductive source patterns disposed between the first conductive source patterns and the horizontal patterns, and the first conductive source patterns extend to the division region and are connected to sidewalls of the division structure.

19. The semiconductor memory device of claim 18, further comprising:

remaining mold patterns disposed between the first conductive source patterns and the first insulating penetration layer and at a same level as the second conductive source patterns, wherein the division structure separates the remaining mold patterns in a horizontal direction.

* * * * *